United States Patent
Saitoh et al.

(10) Patent No.: US 10,663,821 B2
(45) Date of Patent: May 26, 2020

(54) DISPLAY BOARD HAVING INSULATING FILMS AND TERMINALS, AND DISPLAY DEVICE INCLUDING THE SAME

(71) Applicant: SHARP KABUSHIKI KAISHA, Sakai, Osaka (JP)

(72) Inventors: Takao Saitoh, Sakai (JP); Yohsuke Kanzaki, Sakai (JP); Makoto Nakazawa, Sakai (JP); Kazuatsu Ito, Sakai (JP); Seiji Kaneko, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/772,062

(22) PCT Filed: Nov. 1, 2016

(86) PCT No.: PCT/JP2016/082379
§ 371 (c)(1),
(2) Date: Apr. 28, 2018

(87) PCT Pub. No.: WO2017/077994
PCT Pub. Date: May 11, 2017

(65) Prior Publication Data
US 2018/0314122 A1    Nov. 1, 2018

(30) Foreign Application Priority Data
Nov. 6, 2015  (JP) .................................. 2015-218418

(51) Int. Cl.
*G02F 1/1362* (2006.01)
*G06F 3/044* (2006.01)
(Continued)

(52) U.S. Cl.
CPC .... *G02F 1/136286* (2013.01); *G02F 1/13458* (2013.01); *G02F 1/133305* (2013.01);
(Continued)

(58) Field of Classification Search
CPC ............................... H01L 27/124; G02F 1/133
(Continued)

(56) References Cited

U.S. PATENT DOCUMENTS

| 8,379,177 B2 * | 2/2013 | Jung | ..................... G02F 1/1343 |
| | | | 349/139 |
| 2008/0173900 A1 * | 7/2008 | Yoon | ..................... G02F 1/1345 |
| | | | 257/203 |

(Continued)

FOREIGN PATENT DOCUMENTS

| JP | H11-024094 A | 1/1999 |
| JP | H11-024101 A | 1/1999 |

(Continued)

*Primary Examiner* — Lex H Malsawma
*Assistant Examiner* — Eric W Jones
(74) *Attorney, Agent, or Firm* — ScienBiziP, P.C.

(57) ABSTRACT

An array board includes input terminals, a first interlayer insulating film, a first planarization film, terminal lines, a second planarization film, and protective members. A first interlayer insulating film edge section and a first planarization film edge section are disposed between the input terminals and the display area. The terminal lines in a layer upper than the first planarization film and extending to cross the first interlayer insulating film edge section and the first planarization film edge section are connected to the input terminals. The second planarization film in a layer upper than the terminal lines includes a second planarization film edge section disposed closer to the input terminals relative to the first interlayer insulating edge section and the first planarization film edge section. The protective members in a layer upper than the second planarization film cover sections of the terminals lines not overlapping the second planarization film, respectively.

8 Claims, 19 Drawing Sheets

(51) Int. Cl.
*G02F 1/1345* (2006.01)
*G02F 1/1343* (2006.01)
*H01L 27/12* (2006.01)
*G02F 1/1333* (2006.01)
*G06F 3/041* (2006.01)

(52) U.S. Cl.
CPC .. *G02F 1/133345* (2013.01); *G02F 1/134309* (2013.01); *G06F 3/044* (2013.01); *G06F 3/0412* (2013.01); *H01L 27/124* (2013.01); *H01L 27/1218* (2013.01); *H01L 27/1244* (2013.01); *H01L 27/1248* (2013.01); *H01L 27/1296* (2013.01); *G02F 1/13338* (2013.01)

(58) Field of Classification Search
USPC .......................................................... 257/84
See application file for complete search history.

(56) References Cited

U.S. PATENT DOCUMENTS

| | | | | |
|---|---|---|---|---|
| 2008/0204618 | A1* | 8/2008 | Jung | G02F 1/13452 349/40 |
| 2009/0027579 | A1* | 1/2009 | Aota | G02F 1/134363 349/41 |
| 2009/0108259 | A1* | 4/2009 | Lin | G02F 1/134363 257/59 |
| 2009/0159901 | A1 | 6/2009 | Ikeda et al. | |
| 2009/0283769 | A1* | 11/2009 | Park | G02F 1/13458 257/59 |
| 2010/0271582 | A1* | 10/2010 | Yamakawa | G02F 1/136227 349/138 |
| 2012/0154704 | A1* | 6/2012 | Nakazawa | H01L 27/1214 349/43 |
| 2014/0104508 | A1 | 4/2014 | Yamazaki et al. | |
| 2015/0160760 | A1* | 6/2015 | Sato | G06F 3/044 345/174 |
| 2015/0255327 | A1* | 9/2015 | Park | H01L 27/124 438/668 |
| 2015/0270292 | A1 | 9/2015 | Furukawa | |
| 2016/0035750 | A1* | 2/2016 | Jeon | H01L 27/124 257/72 |
| 2017/0160573 | A1 | 6/2017 | Yamazaki et al. | |

FOREIGN PATENT DOCUMENTS

| | | |
|---|---|---|
| JP | H11-153809 A | 6/1999 |
| JP | 2009-169394 A | 7/2009 |
| JP | 2014-095895 A | 5/2014 |
| WO | 2014/061531 A1 | 4/2014 |

\* cited by examiner

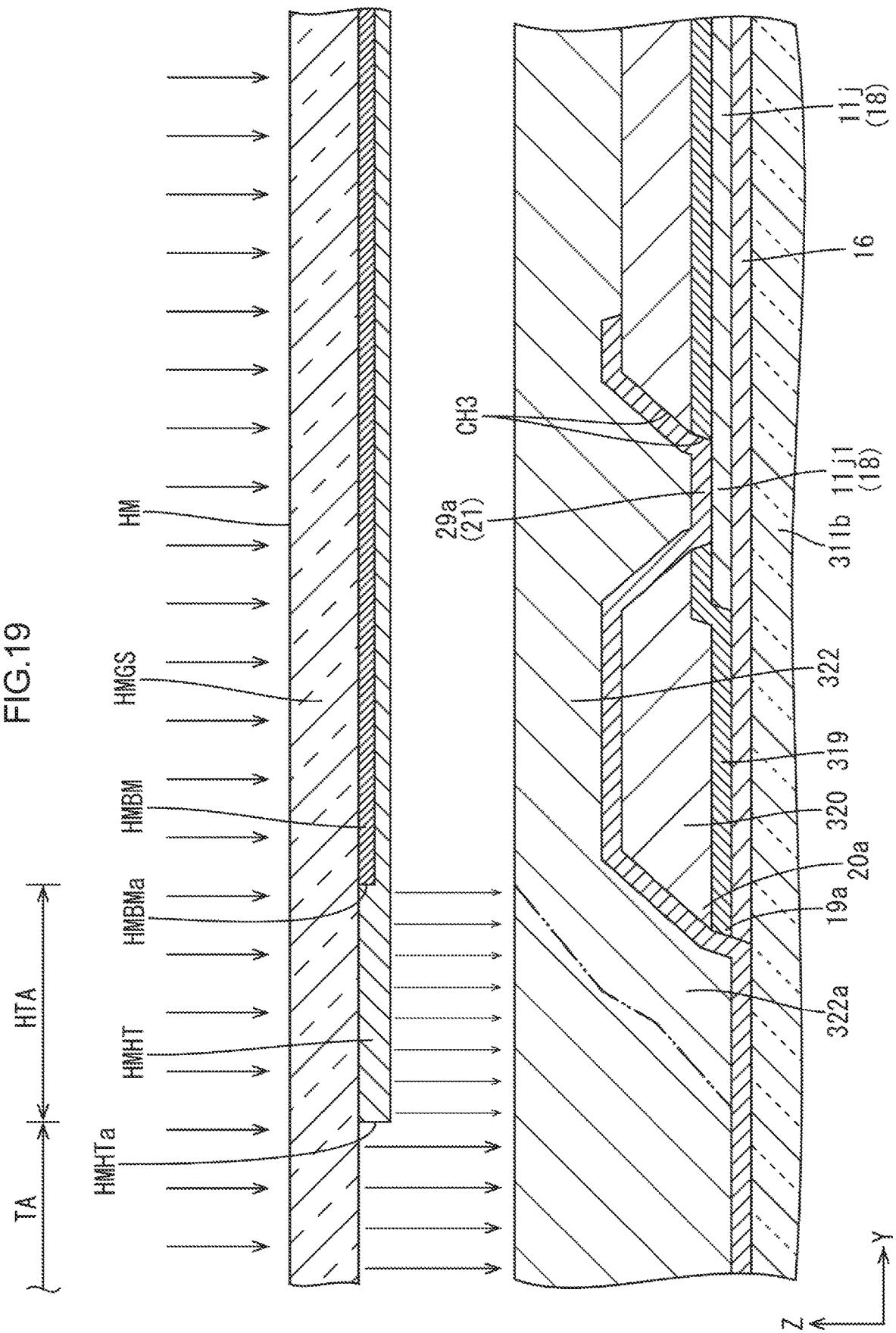

DISPLAY BOARD HAVING INSULATING FILMS AND TERMINALS, AND DISPLAY DEVICE INCLUDING THE SAME

TECHNICAL FIELD

The present invention relates to a display board and a display device.

BACKGROUND ART

A liquid crystal panel disclosed in Patent Document 1 is known as an example of liquid crystal panels used in conventional liquid crystal display devices. The liquid crystal panel disclosed in Patent Document 1 includes an active component array board that includes an interlayer insulating film. The interlayer insulating film includes a protrusion at an interlayer insulating film edge between mounted terminals to reduce resist residues in a post-process even if the interlayer insulating film is formed with a large thickness.

RELATED ART DOCUMENT

Patent Document

Patent Document 1: Japanese Unexamined Patent Application Publication No. H11-24101

Problem to be Solved by the Invention

In the active component array board disclosed in Patent Document 1, thicknesses of the mounted terminals and a pixel electrode material over the mounted terminals may become larger than expected in sections overlapping the interlayer insulating film due to uneven exposure in a production process. Furthermore, the protrusions may be displaced relative to the mounted terminals due to alignment errors. In such cases, the protrusions may not be able to deliver proper performances and the residue of the pixel electrode material may cause a short circuit between the adjacent mounted terminals.

DISCLOSURE OF THE PRESENT INVENTION

The present invention was made in view of the above circumstances. An object is to improve reliability in short-circuit protection.

Means for Solving the Problem

A display board according to the present invention includes a display area for displaying images, a non-display area, terminals, a first insulating film, terminal lines, a second insulating film, and protective members. The non-display area is located outside the display area to surround the display area. The terminals are disposed in the non-display area. The first insulating film is disposed to cross a boundary between the display area and the non-display area. The first insulating film includes a first insulating film edge section that is disposed between the terminals and the display area. The terminal lines are disposed in a layer upper than the first insulating film at least in the non-display area to cross the first insulating film edge section and connected to the terminals. The second insulating film is disposed in a layer upper than the terminal lines to cross the boundary between the display area and the non-display area. The second insulating film includes a second insulating film edge section that is disposed closer to the terminals relative to the first insulating film edge section. The protective members are formed from a transparent electrode film and disposed in a layer upper than the second insulating film at least in the non-display area. The protective members cover sections of the terminal lines not overlapping the second insulating film, respectively.

The terminal lines are disposed in the non-display area and connected to the terminals. The terminal lines are disposed in the layer upper than the first insulating film to cross the first insulating film edge section that is disposed between the terminals and the display area. The sections of the terminal lines not overlapping the second insulating film that is disposed in the layer upper than the terminal lines are covered with the protective members that are disposed in the layer upper than the second insulating film and formed from the transparent electrode film and protected. The sections of the terminal lines overlapping the first insulating film tend to have a larger width because uneven exposure is more likely to occur in the sections in comparison to the sections not overlapping the first insulating film during exposure in patterning. A distance between the sections of the adjacent terminal lines not overlapping the first insulating film is smaller than a distance between the sections of the adjacent terminal lines overlapping the first insulating film. If the sections of the terminal lines overlapping the first insulating film edge section are not covered with the second insulating film, residues of the transparent electrode film are more likely to be produced around the first insulating film edge section during the patterning of the transparent electrode film that forms the protective members. The residues may cause a short circuit between the sections of the terminal lines overlapping the first insulating film edge section, that is, the sections between which the distance is smaller.

Because the second insulating film edge section of the second insulating film is disposed closer to the terminals relative to the first insulating film edge section, the sections of the terminal lines overlapping the first insulating film edge section, that is, the sections between which the distance is smaller are covered with the second insulating layer. The sections of the terminal lines overlapping the second insulating film edge section do not overlap the first insulating film. Therefore, the distance between the adjacent terminal lines is larger. Even if the residues of the transparent electrode film are produced around the second insulating film edge section during the patterning of the transparent electrode film, the residues are less likely to cause a short circuit between the sections of the terminal lines overlapping the second insulating film edge section.

Preferable embodiments of the present invention may have the following configurations.

(1) The second insulating film may include at least one projection that project from the second insulating film edge section toward the terminals. The at least one projection may be disposed between the adjacent terminal lines. According to the configuration, a creepage distance between the adjacent terminal lines at the second insulating film edge section is increased by dimensions of the at least one projection. Therefore, even if the residues of the transparent electrode film that forms the protective members are produced around the second insulating film edge section, the residues of the transparent electrode film are less likely to be produced across an area between the adjacent terminal lines. The at least one projection is included in the second insulating film disposed in the layer upper than the terminal lines. Therefore, the projection is positioned relative to the terminal lines with high accuracy. A reason why the high accuracy can be achieved is that an insulating film is usually aligned with lines formed from a metal film and disposed in a lower layer and patterned. According to the configuration, further higher reliability can be achieved in short-circuit protection between the adjacent terminal lines.

(2) The display board may further include a display component, a component connecting portion, a common electrode, a third insulating film, and a pixel electrode. The display component may be disposed in the display area. The component connecting portion may be disposed in a layer upper than the first insulating film in the display area and connected to the display component. The component connecting portion may be in the layer in which the terminal lines are disposed. The common electrode may be disposed in a layer upper than the second insulating film. The common electrode may include a hole at a position overlapping the component connecting portion. The common electrode may be formed from the transparent electrode film that also forms the protective members. The third insulating film may be disposed in a layer upper than the common electrode at least in the display area. The third insulating film may include a component contact hole that communicates with the second insulating film at a position overlapping the component connecting portion. The pixel electrode may be disposed in a layer upper than the third insulating film in the display area and connected to the component connecting portion via the component contact hole. The pixel electrode may be formed from a second transparent electrode film. According to the configuration, the pixel electrode is connected to the component connecting portion via the component contact holes of the third insulating film and the second insulating film which communicate with each other. The pixel electrode is connected to the display component via the component connecting portion. The pixel electrode may be disposed to overlap the common electrode with the third insulating film. Therefore, a potential difference is created between the pixel electrode and the common electrode according to a voltage applied by the display component. The pixel electrode can exhibit a specified tone based on the potential difference. The hole of the common electrode is provided at the position overlapping the component connecting portion for short-circuit protection between the common electrode and the pixel electrode. The common electrode is formed by patterning the transparent electrode film that also forms the protective members. During the patterning, the terminal lines are covered with the protective members and protected. Therefore, deterioration of the terminal lines which may occur due to the patterning is less likely to occur.

The hole of the common electrode formed from the transparent electrode film that also forms the protective members needs to be aligned with the component connecting portion in the layer in which the terminal lines are disposed. The component contact holes of the second insulating film and the third insulating film which communicate with each other need to be aligned with the component connecting portion in the layer in which the terminal lines are disposed. The projection included in the second insulating film and the protective members are positioned relative to the terminal lines with high position accuracy. Therefore, further higher reliability can be achieved in short-circuit protection between the adjacent terminal lines.

(3) The common electrode may function as a position detection electrode to obtain an electrostatic capacitance between the position detection electrode and a position input object with which a position is input. According to the configuration, the position input function can be embedded in the display board.

(4) The second insulating film may include a section that does not overlap the first insulating film and a section that overlaps the first insulating film. The section that does not overlap the first insulating film may have a thickness smaller than a thickness of the section that overlaps the first insulating film. According to the configuration, an angle of slope of the second insulating film edge section that is the section of the second insulating film not overlapping the first insulating film is smaller. Therefore, the residues of the transparent electrode film are less likely to be produced around the second insulating film edge section. Therefore, further higher reliability can be achieved in short-circuit protection between the adjacent terminal lines.

(5) The display board may further include a display component and a component line. The display component may be disposed in the display area. The component line may be disposed in a layer lower than the first insulating film at least in the display area and connected to the display component. The terminal line and the component line may include line overlapping sections that overlap each other in the non-display area. The first insulating film may include a line contact hole at a position overlapping the line overlapping sections. The line overlapping sections are connected with each other through the line contact hole. The line overlapping section of the component line disposed in the layer lower than the first insulating film is connected to the line overlapping section of the terminal line disposed in the layer upper than the first insulating film via the lien contact hole of the first insulating film. The terminal lines that cross the first insulating film edge section of the first insulating film are connected to the terminals. Therefore, the residues of the transparent electrode film may cause a short circuit between the adjacent terminal lines. Because the second insulating film edge section of the second insulating film is disposed closer to the terminals relative to the first insulating film edge section, the residues of the transparent electrode film are less likely to cause the short circuit between the adjacent terminal lines.

(6) The first insulating film may include a lower layer-side first insulating film and an upper layer-side first insulating film disposed in an upper layer relative to the lower layer-side first insulating film. In the first insulating film having the two-layer structure including the lower layer-side first insulating film and the upper layer-side first insulating film, when the lower layer-side first insulating film is patterned using the upper layer-side first insulating film as a mask, the angle of slope of the lower layer-side first insulating film at the first insulating film edge section tends to be larger than the angle of slope of the upper layer-side first insulating film at the first insulating film edge section. Therefore, the residues of the transparent electrode film may be produced on the lower layer-side first insulating film at the first insulating film edge section. Because the second insulating film edge section of the second insulating film is located closer to the terminals relative to the first insulating film edge section, the residues of the transparent electrode film are less likely to cause a short circuit between the adjacent terminal lines.

To solve the problem described earlier, a display device according to the present invention includes the display board described above and a common board opposed to the display board. According to the display device having such a configuration, the display board has high reliability in short-circuit protection and thus higher operation reliability can be achieved.

Advantageous Effect of the Invention

According to the present invention, reliability in short-circuit protection can be improved.

BRIEF DESCRIPTION OF THE DRAWINGS

FIG. 19 is a cross-sectional view illustrating an exposing process for exposing a second planarization film with a half tone mask in a production of an array board included in a liquid crystal panel according to a fourth embodiment of the present invention.

MODE FOR CARRYING OUT THE INVENTION

<First Embodiment>

A first embodiment of the present invention will be described with reference to FIGS. 1 to 11. In this section, a liquid crystal panel 11 (a display device, a display panel) included in a liquid crystal display device 10 with a position input function will be described. X-axes, Y-axes, and Z-axes may be present in drawings. The axes in each drawing correspond to the respective axes in other drawings to indicate the respective directions. Upper sides and lower sides in in FIGS. 3, 6 and 7 correspond to a front side and a rear side of the liquid crystal panel 11, respectively.

Figure 1:
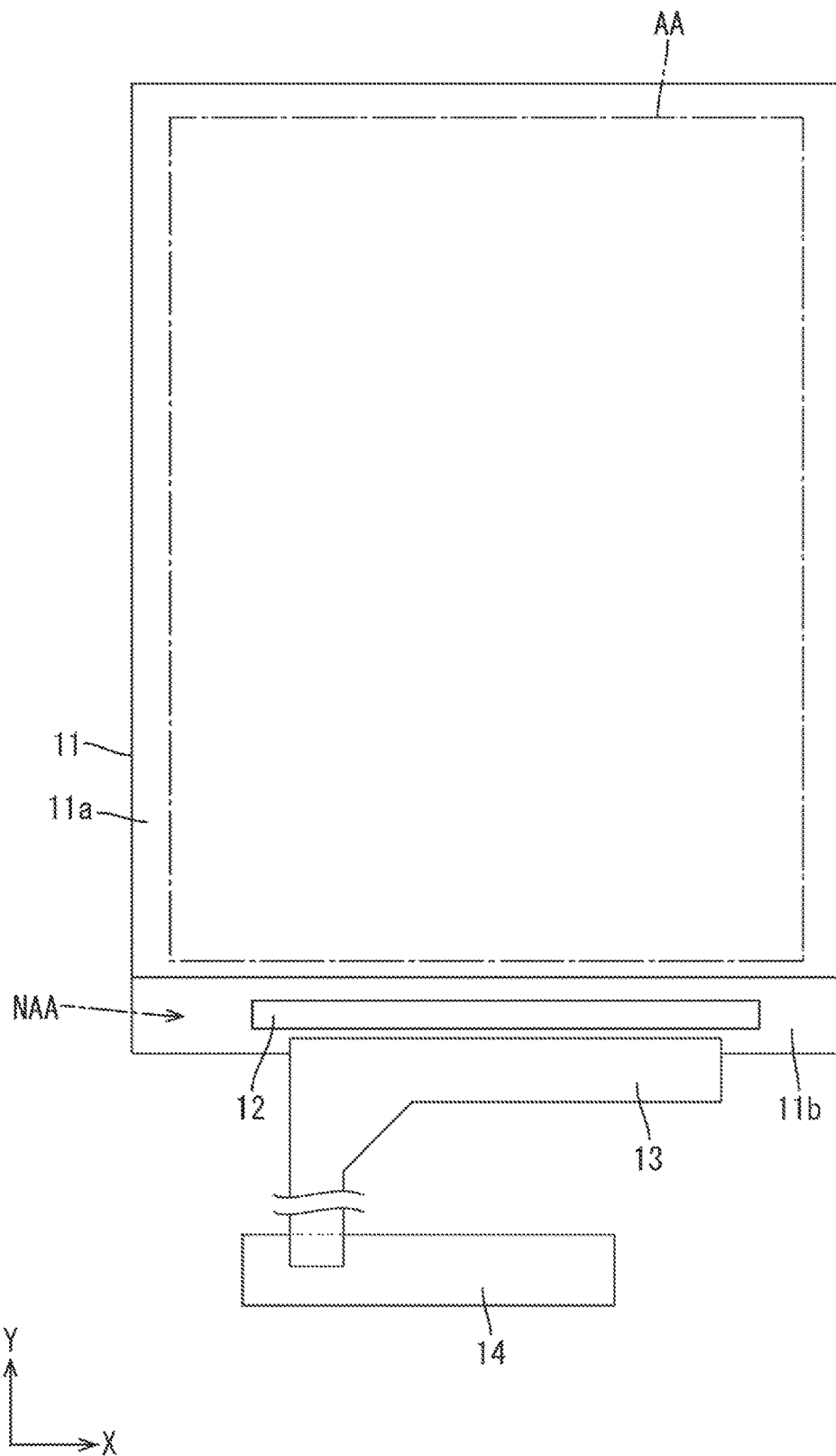
FIG. 1 is a plan view of a liquid crystal panel included in a liquid crystal display device according to a first embodiment of the present invention.

The liquid crystal display device 10 has a rectangular overall shape. As illustrated in FIG. 1, the liquid crystal display device 10 includes at least the liquid crystal panel 11 and a backlight unit (a lighting device). The liquid crystal panel 11 is configured to display images. The backlight unit is an external light source disposed behind the liquid crystal panel 11 and configured to apply light to the liquid crystal panel 11 for displaying images. Among components of the liquid crystal display device 10, the liquid crystal panel 11 will be described in detail but other components including the backlight unit will not be described in detail because they are well known.

As illustrated in FIG. 1, the liquid crystal panel 11 has a vertically-long rectangular overall shape. At a position closer to a first end of the liquid crystal panel 11 with respect to a long direction of the liquid crystal panel 11 (the upper side in FIG. 1), a display area AA (an active area) in which images are displayed is provided. A driver 12 and a flexible circuit board 13 for supplying various signals are mounted at positions closer to a second end of the liquid crystal panel 11 with respect to the long direction of the liquid crystal panel 11 (the lower side in FIG. 1). In the liquid crystal panel 11, the area outside the display area AA is the non-display area NAA (a non-active area) in which images are not displayed. The non-display area NAA includes a frame-shaped area that surrounds the display area AA (a frame-shaped section of a CF board 11a, which will be described later) and an area that is provided at the second end with respect to the long direction (a section of an array board 11b which is exposed without overlapping the CF board 11a, which will be described later). The area provided at the second end with respect to the long direction includes a mounting area (an attachment area) in which the driver 12 and the flexible circuit board 13 are mounted. The short direction of the liquid crystal panel 11 corresponds with the X-axis direction and the long direction of the liquid crystal panel 11 corresponds with the Y-axis direction. Furthermore, the normal direction to the plate surface (the display surface) corresponds with the Z-axis direction. A control circuit board 14 (a control circuit board) which is a signal source is connected to an end of the flexible circuit board 13 on an opposite side from the liquid crystal panel 11 side. In FIG. 1, a chain line in a frame shape indicates an outline of the display area AA and an area outside the chain line is the non-display area NAA.

Components mounted or connected to the liquid crystal panel 11 (the driver 12, the flexible circuit board 13, and the control circuit board 14) will be described. As illustrated in FIG. 1, the driver 12 is an LSI chip including drive circuits. The driver 12 is configured to operate according to signals supplied by the control circuit board 14 to process the input signal supplied by the control circuit board 14, to generate output signals, and to output the output signals to the display area AA in the liquid crystal panel 11. The driver 12 has a vertically-long rectangular shape (an elongated shape that extends along the short side of the liquid crystal panel 11) in a plan view. The driver 12 is directly mounted in the non-display area NAA of the liquid crystal panel 11 (or the array board 11b, which will be described later), that is, mounted by the chip-on-glass (COG) mounting method. A long-side direction and a short-side direction of the driver 12 correspond to the X-axis direction (the short-side direction of the liquid crystal panel 11) and the Y-axis direction (the long-side direction of the liquid crystal panel 11), respectively.

The flexible circuit board 13 includes a base member made of synthetic resin having insulating property and flexibility (e.g., polyimide resin). A number of traces are formed on the base member (not illustrated). As illustrated in FIG. 1, a first end of the long dimension of the flexible circuit board 13 is connected to the control circuit board 14 as described above. A second end of the long dimension of the flexible circuit board 13 is connected to the liquid crystal panel 11 (the array board 11b, which will be described later). In the liquid crystal display device 10, the flexible circuit board 13 is folded back such that a cross-sectional shape thereof forms a U-like shape. At the ends of the long dimension of the flexible circuit board 13, sections of the traces are exposed to the outside and configured as terminals (not illustrated). The terminals are electrically connected to the control circuit board 14 and the liquid crystal panel 11. With this configuration, singles supplied by the control circuit board 14 are transmitted to the liquid crystal panel 11.

As illustrated in FIG. 1, the control circuit board 14 is disposed on the back side of the backlight unit. The control circuit board 14 includes a substrate made of paper phenol or glass epoxy resin and electronic components mounted on the substrate and configured to supply various signals to the driver 12. Traces (conductive paths) which are not illustrated are formed in predetermined patterns. The first end of the flexible circuit board 13 is electrically and mechanically connected to the control circuit board 14 with an anisotropic conductive film (ACF), which is not illustrated.

Figure 3:
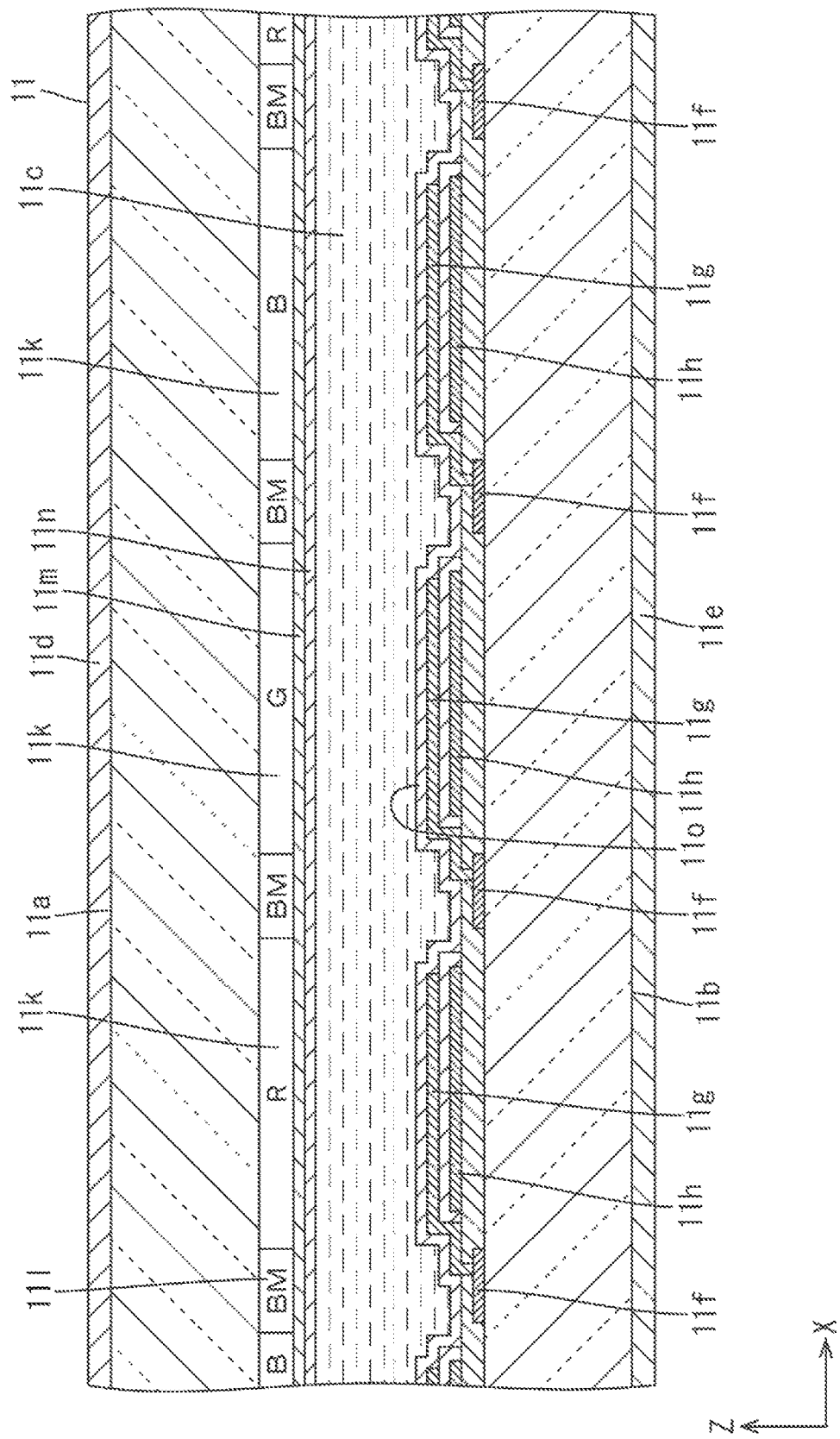
FIG. 3 is a schematic cross-sectional view illustrating a cross-sectional configuration of the liquid crystal panel in a display area.

The liquid crystal panel 11 will be described. As illustrated in FIG. 3, the liquid crystal panel 11 includes a pair of boards 11a and 11b and a liquid crystal layer 11c (a medium layer) in a space between the boards 11a and 11b. The liquid crystal layer 11c includes liquid crystal molecules having optical characteristics that vary according to application of electric field. The liquid crystal layer 11c is surrounded and sealed by a sealing agent disposed between the boards 11a and 11b. The sealing agent is not illustrated. One of the boards 11a and 11b on the front is the CF board 11a (a common board) and one on the rear (on the back) is the array board 11b (a display board, an active matrix board, a component board). The CF board 11a and the array board 11b include glass substrates and various films that are formed in layers on inner surfaces of the glass substrates. Polarizing plates 11d and 11e are attached to outer surfaces of the boards 11a and 11b, respectively.

Figure 4:
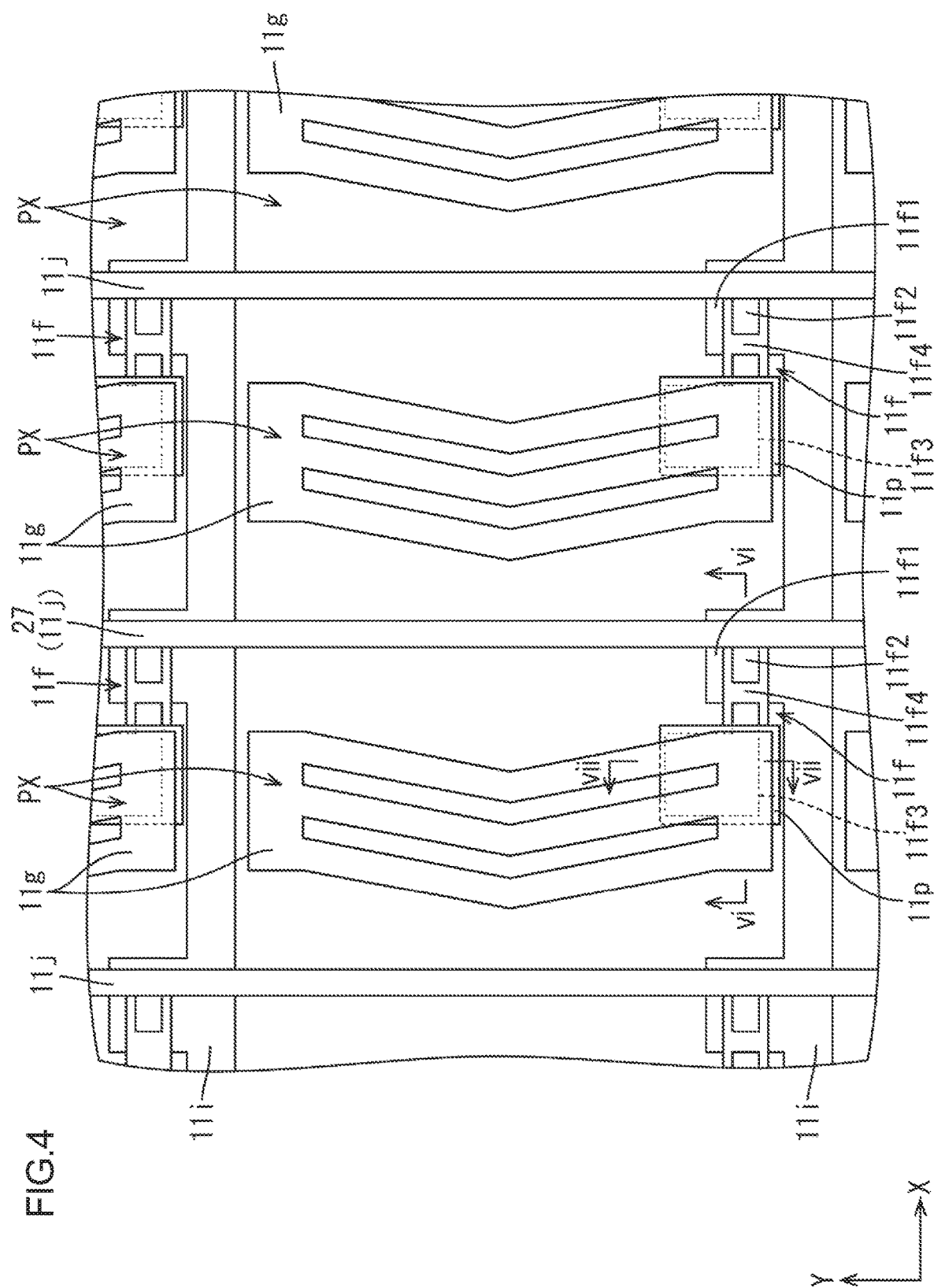
FIG. 4 is a plan view schematically illustrating a wiring configuration of an array board included in the liquid crystal panel.
Figure 6:
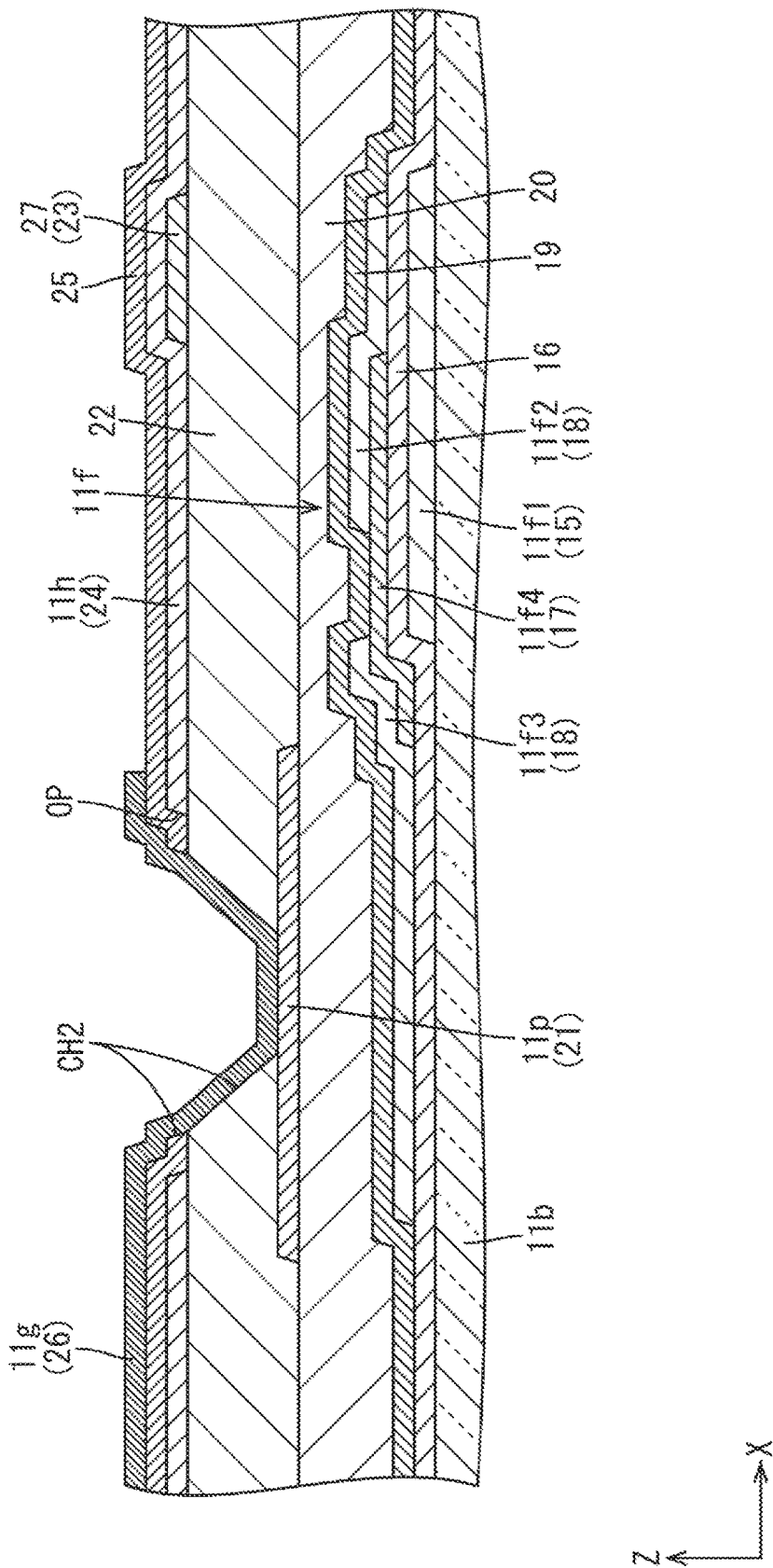
FIG. 6 is a cross-sectional view along line vi-vi in FIG. 4.

On an inner surface of the array board 11b (on the liquid crystal layer 11c side in the display area AA, an opposed surface opposed to the CF board 11a), as illustrated in FIGS. 4 and 6, thin film transistors 11f (TFTs, display components) which are switching components and pixel electrodes 11g are arranged in a matrix. Gate lines 11i (scan lines) and source lines 11j (data lines, signal lines, component lines) are routed in a grid to surround the TFTs 11f and the pixel electrodes 11g. The gate lines 11i and the source lines 11j are connected to gate electrodes 11f1 and source electrodes 11f2 of the TFTs 11f, respectively. The pixel electrodes 11g are connected to drain electrodes 11f3 of the TFTs 11f. The TFTs 11f are driven based on signals supplied to the gate lines 11i and the source lines 11j. Voltages are applied to the pixel electrodes 11g in accordance with the driving of the TFTs 11f. The TFTs 11f include channels 11f4 that connect the drain electrodes 11f3 to the source electrodes 11f2. In this embodiment, a direction in which the gate lines 11i extend and a direction in which the source lines 11j extend correspond with the X-axis direction and the Y-axis direction in each drawing, respectively. The pixel electrodes 11g are disposed in quadrilateral areas defined by the gate lines 11i and the source lines 11j. The each pixel electrode 11g includes slits. The pixel electrodes 11g area connected to the drain electrodes 11f3 of the respective TFTs 11f via the TFT connecting portions 11p (component connecting portions). The common electrode 11h is disposed on the inner surface of the array board 11b in addition to the pixel electrodes 11g. When a potential difference is created between the electrodes 11g and 11h, a fringe electric field (an oblique electric field) including a component along the plate surface of the array board 11b and a component in the normal direction to the plate surface of the array board 11b. The liquid crystal panel 11 operates in fringe field switching (FFS) mode that is an improved version of in-plane switching (IPS) mode.

Figure 7:
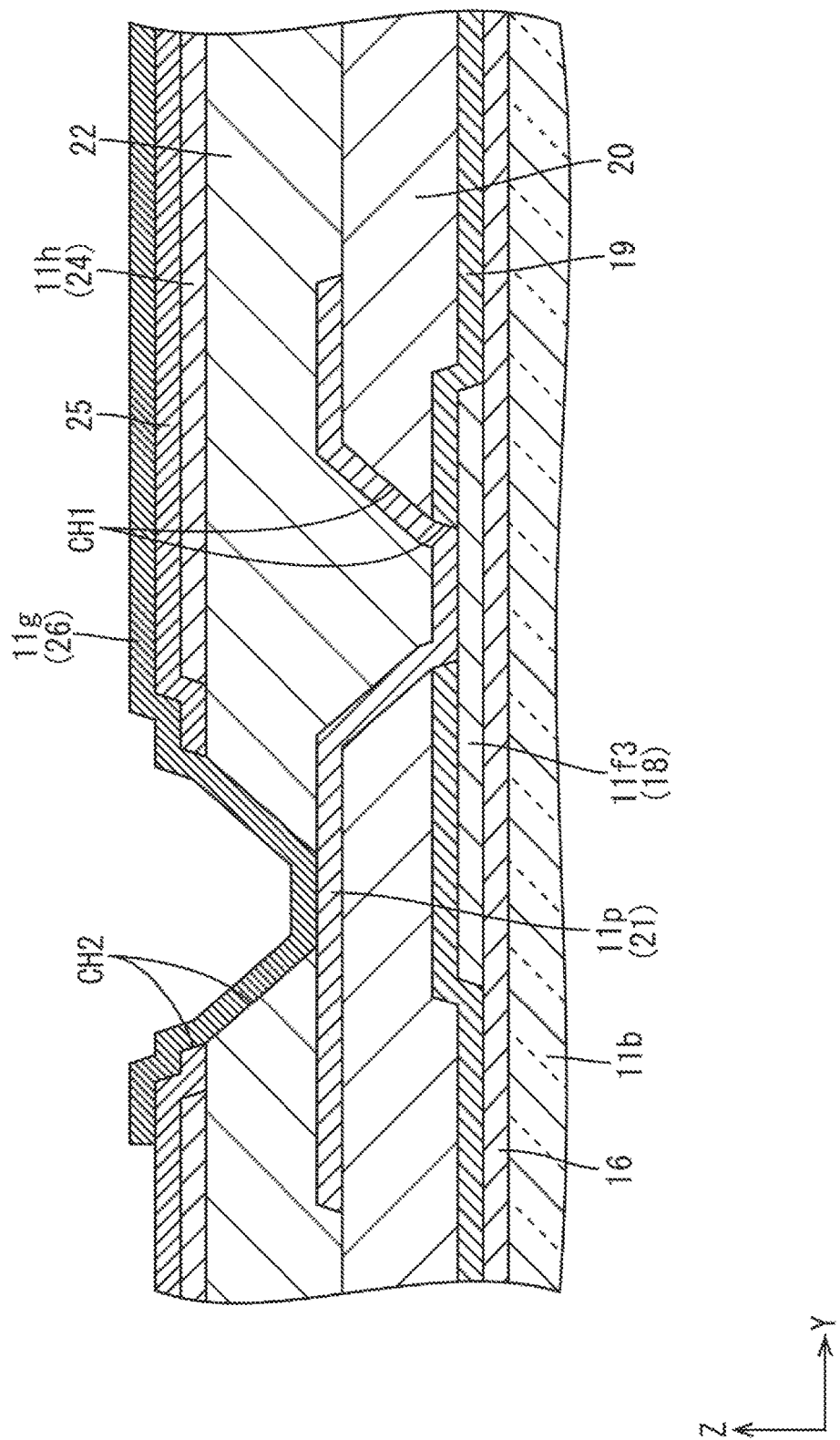
FIG. 7 is a cross-sectional view along line vii-vii in FIG. 4.

Various films are formed in layers on an inner surface of the array board 11b by the known photolithography method. The films will be described. As illustrated in FIGS. 6 and 7, on the array board 11b, a first metal film 15 (a gate metal film), a gate insulating film 16 (an insulating film), the semiconductor film 17, a second metal film 18 (a source metal film), a first interlayer insulating film 19 (a lower layer-side first insulating film, a first insulating film), a first planarization film 20 (an upper layer-side first insulating film, a first insulating film), a third metal film 21 (a component connecting metal film), a second planarization film 22 (a second insulating film), a fourth metal film 23 (a position detecting line metal film), a first transparent electrode film 24 (a lower layer-side transparent electrode film), a second interlayer insulating film 25 (a third insulating film), and a second transparent electrode film 26 (an upper layer-side transparent electrode film) are layered in this sequence from a lower layer side (the glass substrate). The alignment film 11o disposed in a layer upper than the second transparent electrode film 26 is not illustrated in in FIGS. 6 and 7.

The first metal film 15 is a laminated film that includes three layers: a titanium (Ti) layer; an aluminum (Al) layer; and a titanium layer. The gate lines 11i are formed from the first metal film 15. As illustrated in FIGS. 6 and 7, the gate insulating film 16 is disposed in a layer at least upper than the first metal film 15. The gate insulating film 16 may be made of inorganic material such as silicon oxide ($SiO_2$). The gate insulating film 16 is disposed between the first metal film 15 (the gate lines 11i) and the second metal film 18 (the source lines 11j) that are insulated from each other by the gate insulating film 16. The semiconductor film 17 is disposed in a layer upper than the gate insulating film 16. The semiconductor film 17 is a thin film made of substantially transparent oxide semiconductor. An oxide semiconductor of the semiconductor film 17 may be an In—Ga—Zn—O based semiconductor (indium gallium zinc oxide) containing indium (In), gallium (Ga), zinc (Zn), and oxygen (O). The In—Ga—Zn—O based semiconductor is a ternary oxide containing indium (In), gallium (Ga), and zinc (Zn). The ratio (the compound ratio) of indium to gallium and zinc is not limited to a specific ratio. Examples of the ratio include: In:Ga:Zn=2:2:1, In:Ga:Zn=1:1:1, In:Ga:Zn=1:1:2. In this embodiment, the ratio of Indium to gallium and zinc in the In—Ga—Zn—O based semiconductor is 1:1:1. The oxide semiconductor (the In—Ga—Zn—O based semiconductor) may have amorphous properties but preferably have crystalline properties, that is, including crystalline substances. A preferable oxide semiconductor having crystalline properties may be a crystalline In—Ga—Zn—O based semiconductor with the c-axis is substantially perpendicular to a layer surface. An example of crystalline structures of such an oxide semiconductor (the In—Ga—Zn—O based semiconductor) is disclosed in Japanese Unexamined Patent Application Publication No. 2012-134475. Whole disclosure of Japanese Unexamined Patent Application Publication No. 2012-134475 is incorporated by reference.

As illustrated in FIGS. 6 and 7, the second metal film 18 is disposed in a layer upper than at least the semiconductor film 17. The second metal film 18 is a laminated film that includes three layers: a titanium layer; an aluminum layer; and a titanium layer, similar to the first metal film 15. The source lines 11*j*, the source electrodes 11*f*2, and the drain electrodes 11*f*3 are formed from the second metal film 18. The first interlayer insulating film 19 is disposed in a layer upper than at least second metal film 18. The first interlayer insulating film 19 is made of inorganic material such as silicon oxide ($SiO_2$). The first planarization film 20 is disposed in a layer upper than the first interlayer insulating film 19. The first planarization film 20 is made of acrylic resin material that is an organic material (e.g., polymethylmethacrylate resin (PMMA)). The first interlayer insulating film 19 and the first planarization film 20 are disposed in a layer between the third metal film 21 and the second metal film 18 and the semiconductor film 17 that are insulated from each other by the first interlayer insulating film 19 and the first planarization film 20. The third metal film 21 is disposed in a layer upper than at least the first planarization film 20. The third metal film 21 is a laminated film that includes three layers: a titanium layer; an aluminum layer; and a titanium layer, similar to the first metal film 15 and the second metal film 18. The TFT connecting portions 11*p* in the display area AA and input terminals 28 and terminal lines 29 in the non-display area NAA, which will be described later, are formed from the third metal film 21.

As illustrated in FIGS. 6 and 7, the second planarization film 22 is disposed in a layer upper than the third metal film 21 and the first planarization film 20. The second planarization film 22 is made of acrylic resin material that is an organic material (e.g., polymethylmethacrylate resin (PMMA)) similar to the first planarization film 20. The second planarization film 22 is disposed in the layer between the third metal film 21 and the fourth metal film 23 and the first transparent electrode film 24 that are insulated from each other by the second planarization film 22. The fourth metal film 23 is disposed in a layer upper than at least the second planarization film 22. The third metal film 21 is a laminated film that includes three layers: a titanium (Ti) layer; an aluminum (Al) layer; and a titanium layer, similar to the first metal film 15, the second metal film 18, and the third metal film 21. The position detection lines 11*q*, which will be described later, are formed from the fourth metal film 23. The first transparent electrode film 24 is disposed in a layer upper than the fourth metal film 23 and the first planarization film 20. The first transparent electrode film 24 is made of transparent electrode material such as indium tin oxide (ITO) and zinc oxide (ZnO). The common electrode 11*h* in the display area AA and protective members 30 in the non-display area NAA, which will be described later, are formed from the first transparent electrode film 24. The second interlayer insulating film 25 is disposed in a layer upper than at least first transparent electrode film 24. The second interlayer insulating film 25 is made of inorganic material such as silicon nitride (SiNx). The second interlayer insulating film 25 is disposed in the layer between the first transparent electrode film 24 and the second transparent electrode film 26 that are insulated from each other by the second interlayer insulating film 25. The second transparent electrode film 26 is disposed in a layer upper than the second interlayer insulating film 25. The second transparent electrode film 26 is made of transparent electrode material such as indium tin oxide (ITO) and zinc oxide (ZnO) similar to the first transparent electrode film 24. The pixel electrodes 11*g* are formed from the second transparent electrode film 26. Among the insulating films 16, 19, 20, 22, and 25 described above, the first planarization film 20 and the second planarization film 22 are the organic insulating films having thicknesses larger than those of the other insulating films (inorganic insulating films) 16, 19, and 25. The first planarization film 20 and the second planarization film 22 have functions of planarizing surfaces. Among the insulating films 16, 19, 20, 22, and 25 described above, the gate insulating film 16, the first interlayer insulating film 19, and the second interlayer insulating film 25 other than the first planarization film 20 and the second planarization film 22 are the inorganic insulating films having thicknesses smaller than those of the organic insulating films, that is, the first planarization film 20 and the second planarization film 22.

As illustrated in FIG. 4, each TFT connecting portion 11*p* (the component connecting portion) has a vertically-long rectangular shape. The TFT connecting portions 11*p* are two-dimensionally arranged to overlap the drain electrodes 11*f*3 of the corresponding TFTs 11*f* and the corresponding pixel electrodes 11*g* in a plan view. As illustrated in FIG. 7, the first interlayer insulating film 19 and the first planarization film 20 include first TFT contact holes CH1 (first component contact holes) in areas that overlap the first TFT connecting portions 11*p* and the drain electrodes 11*f*3. The TFT connecting portions 11*p* in the upper layer are connected to the drain electrodes 11*f*3 in the lower layer through the first TFT contact holes CH1. As illustrated in FIG. 6, the second planarization film 22 and the second interlayer insulating film 25 include second TFT contact holes CH2 (second component contact holes, component contact holes) in areas that overlap the TFT connecting portions 11*p* and the drain electrodes 11*f*3 but not overlap the first TFT contact holes CH1. The pixel electrodes 11*g* in the upper layer are connected to the TFT connecting portions 11*p* in the lower layer through the second TFT contact holes CH2. Although four insulating films 19, 20, 22, and 25 are disposed between the pixel electrodes 11*g* and the drain electrodes 11*f*3, the pixel electrodes 11*g* and the drain electrodes 11*f*3 are connected to each other via the TFT connecting portions 11*p* disposed therebetween. Sections of the common electrode 11*h* overlapping the second TFT contact holes CH2 (sections of the TFT connecting portions 11*p*) include holes OP to reduce an occurrence of short circuit between the common electrode 11*h* and the pixel electrodes 11*g*. The insulating films 16, 19, 20, 22, and 25 are formed in solid patterns to cover about the entire display area AA of the array board 11*b* except for the contact holes CH1 and CH2.

Figure 5:
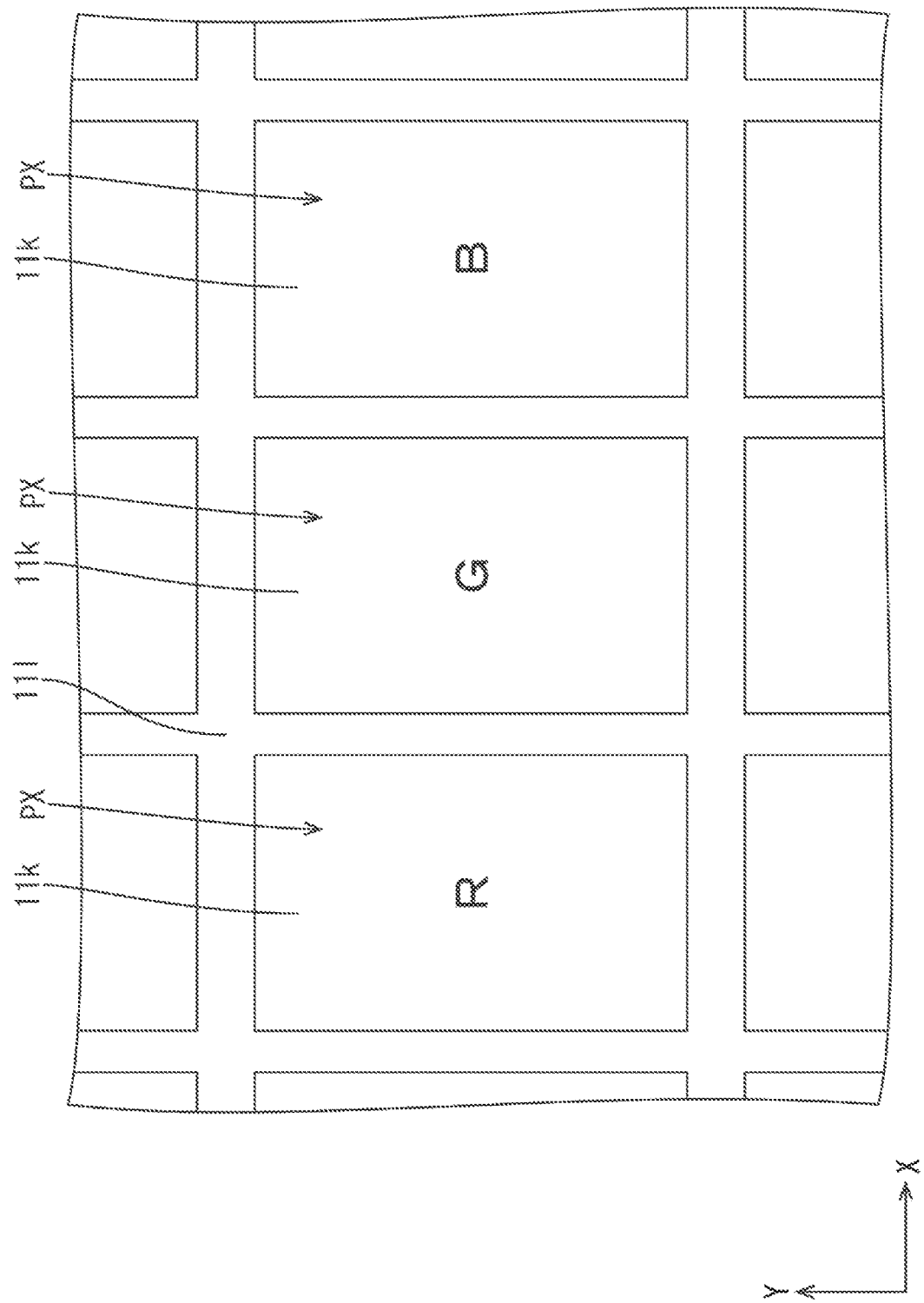
FIG. 5 is a plan view schematically illustrating a wiring configuration of a CF board included in the liquid crystal panel.

As illustrated in FIGS. 3 and 5, on the inner surface of the CF board 11*a* in the display area AA, color filters 11*k* are arranged at positions opposed to the pixel electrodes 11*g* on the array board 11*b*. The color filters 11*k* include red (R), green (G), and blue (B) color portions in three colors. The R color portions, the G color portions, and the B color portion are repeatedly arranged to form a matrix. The color portions (the pixels PX) of the color filters 11*k* arranged in the matrix are separated from one another with a light blocking portion 11*l* (a black matrix). With the light blocking portion 11*l*, color mixture of different colors of light rays that pass through the color portions is less likely to occur. The light blocking portion 11*l* is formed in a grid in the plan view. The light blocking portion 11*l* includes dividing sections and a frame section. The dividing sections form a grid shape in the plan view and separate the color portions from one another. The frame section has a frame shape (a picture frame shape) in the plan view and surrounds the dividing sections from the peripheral sides. The dividing sections of the light blocking portion 11*l* are disposed to overlap the gate lines 11*i* and the source lines 11*j* in the plan view. The frame section of the light blocking portion 11*l* extends along the sealing member and has a vertically-long rectangular shape in the plan view. An overcoat film 11*m* (a planarization film) is disposed over surfaces of the color filters 11*k* and the light blocking portion 11*l* on the inner side. In the liquid crystal panel 11, each color potion of the color filter 11*k* and the pixel electrode 11*g* that is opposed to the color potion form a single pixel PX. The pixels PX include red pixels, green pixels, and blue pixels. The red pixels include the R color portions of the color filters 11*k*. The green pixels include the G color portions of the color filters 11*k*. The blue pixels include the B color portions of the color filters 11*k*. The pixels PX in three colors are repeatedly arranged along the row direction (the X-axis direction) on the plate surface of the liquid crystal panel 11 to form pixel lines. A number of the pixel lines are arranged along the column direction (the Y-axis direction). Namely, a number of the pixels PX are arranged in a matrix in the display area AA of the liquid crystal panel 11. Alignment films 11*n* and 11*o* are formed in inner most layers on the boards 11*a* and 11*b* to contact the liquid crystal layer 11*c*. The alignment films 11*n* and 11*o* are for orientating the liquid crystal molecules in the liquid crystal layer 11*c*.

Figure 2:
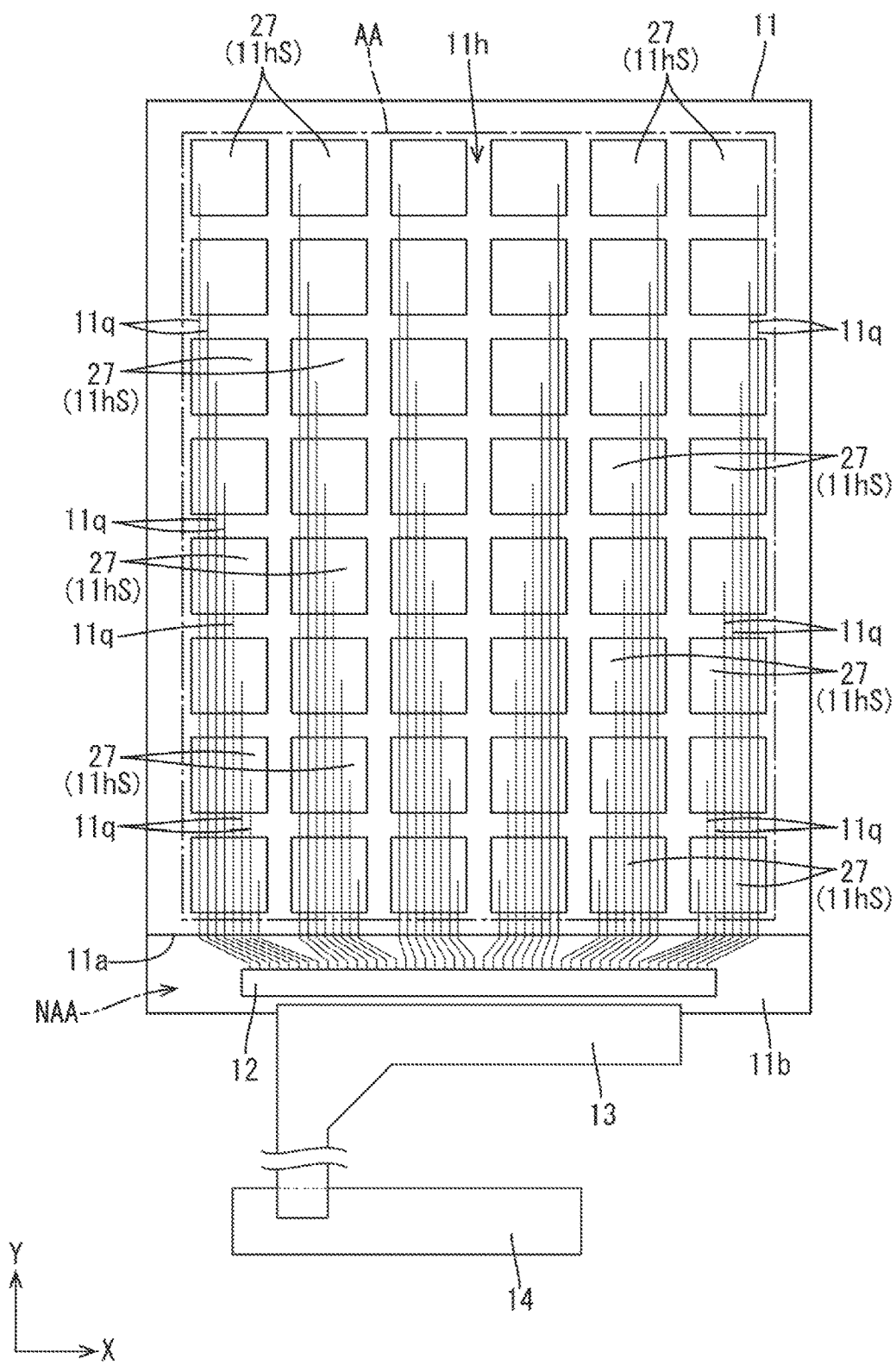
FIG. 2 is a plan view illustrating two-dimensional arrangement of a common electrode on an array board included in the liquid crystal panel.

As described earlier, the liquid crystal panel 11 according to this embodiment has the display function and the position input function (the position detection function). The display function is for displaying images. The position input function is for detecting positions (input positions) input by the user based on images that are displayed. The liquid crystal panel 11 includes a touchscreen pattern integrated therein (in-cell touchscreen technology) for performing the position input function. The touchscreen pattern uses a so-called projection type electrostatic capacitance method. A detection method of the touchscreen pattern is a self-capacitance method. As illustrated in FIG. 2, the touchscreen pattern is formed on the array board 11*b* of the pair of boards 11*a* and 11*b*. The touchscreen pattern includes position detection electrodes 27 arranged in a matrix within a plane of the array board 11*b*. The position detection electrodes 27 are disposed in the display area AA of the array board 11*b*. The display area AA of the liquid crystal panel 11 substantially corresponds with a touching area in which input positions can be detected. The non-display area NAA of the liquid crystal panel 11 substantially corresponds with a non-touching area in which the input positions cannot be detected. When the user brings his or her finger (a position detection object), which is a conductive member, closer to the surface of the liquid crystal panel 11 to input a position based on the image displayed in the display area AA of the liquid crystal panel 11, an electrostatic capacitance is obtained between the finger and the position detection electrode 27. The electrostatic capacitance detected by the position detection electrode 27 closer to the finger varies from the electrostatic capacitance when the finger is away from the position detection electrode 27 as the finger approaches thereto. The electrostatic capacitance detected at the position detection electrode 27 closer to the finger is different from the electrostatic capacitance detected at any of the other position detection electrodes 27 away from the finger. Therefore, the input position can be detected based on the difference in electrostatic capacitance. A parasitic capacitance may exist between the position detection electrode 27 away from the finger and a conductive member other than the finger.

The position detection electrodes 27 are included in the common electrode 11*h* in the array board 11*b*. As illustrated in FIG. 2, the common electrode 11*h* includes common electrode segments 11*h*S that are separated from each other and arranged in a grid within the plane of the array board 11*b*. The common electrode segments 11*h*S are configure as the position detection electrodes 27. In comparison to a configuration in which position detection electrodes are provided separately from the common electrode 11*h*, the configuration of this embodiment is more preferable for simplifying the structure and reducing the cost. The position detection electrodes 27 (or the common electrode segments 11*h*S) are arranged in lines along the X-axis direction (the row direction) and in lines along the Y-axis direction (the column direction) to form a matrix. Each position detection electrode 27 has a rectangular shape in a plan view and sides, each of which is some millimeters. Namely, each position detection electrode 27 is larger than each pixel PX (the pixel electrode 11*g*) in the plan view and disposed in an area in which the multiple pixels PX are arranged along the X-axis direction and Y-axis direction. FIG. 2 schematically illustrates the arrangement of the position detection electrodes 27. The number and the arrangement of the position detection electrodes 27 may be altered from those in the drawing where appropriate.

As illustrated in FIG. 2, position detection lines 11*q* are connected to the position detection electrodes 27 (or the common electrode segments 11*h*S). In the display area AA, the position detection lines 11*q* linearly extend along the Y-axis direction, that is, the extending direction of the source lines 11*j* (the column line). The position detection lines 11*q* have lengths corresponding to the position detection electrodes 27 to which the position detection lines 11*q* are connected, respectively. Namely, a first end of each position detection line 11*q* is disposed over the corresponding position detection electrode 27 to which the first end is connected in the display area AA and a second end of each detection line 11*q* disposed in the non-display area NAA is connected to the driver 12. The driver 12 is configured to drive the TFTs 11*f* for image display and the position detection electrodes 27 for position detection. Namely, the driver 12 has a display function and a position detection function. As described earlier, the position detection lines 11*q* are formed from the fourth metal film 23 and the position detection electrodes 27, that is, the common electrode 11*h* is formed from the first transparent electrode film 24. The position detection electrodes 11*q* are directly connected to the position detection electrodes 27 without contact holes. The position detection lines 11*q* are connected to not only the position detection electrodes 27 to which the respective position detection electrodes 27 are connected but also other position detection electrodes 27 between the position detection electrodes 27 and the driver 12. According to the configuration in which the position detection lines 11*q* are connected to the position detection electrodes 27 in each column (the position detection electrodes 27 arranged along the extending direction of the position detection lines 11*q*), the position detection electrode 27 to which the position is actually input can be identified by extracting a combination of the position detection lines 11q that have detected the position from the position detection lines 11q in the same column. As illustrated in FIG. 4, the position detection lines 11q are disposed to overlap the specific source lines 11j (the light blocking portion 11l) in the plan view but not the pixels PX. According to the arrangement, a reduction in aperture ratio of the pixels PX by the position detection lines 11q is less likely to occur.

Next, the configuration of the section of the array board 11b in the non-display area NAA will be described. A non-overlapping section of the array board in the non-display area NAA does not overlap the CF board 11a. As illustrated in FIG. 1, the end of the flexible circuit board 13 and the driver 12 are mounted in the non-overlapping area. The end of the flexible circuit board 13 is disposed in an edge area of the non-overlapping section along the short direction of the array board 11b (the X-axis direction). The driver 12 is disposed on the array board 11b closer to the display area AA relative to the flexible circuit board 13. In a driver 12 mounting area of the array board 11b in which the driver 12 is mounted, output terminals (not illustrated) and input terminals 28 (terminals) are disposed. The output terminals are for outputting signals to the driver 12. The input terminals 28 are for receiving signals from the driver 12. In a flexible circuit board 13 mounting area of the array board 11b in which the flexible circuit board 13 is mounted, flexible board connected terminals (not illustrated) connected to the flexible circuit board 13 are disposed. The input terminals 28 are disposed closer to the display area AA in comparison to the other terminals (the output terminals and the flexible circuit board connected terminals) with respect to the Y-axis direction.

Figure 8:
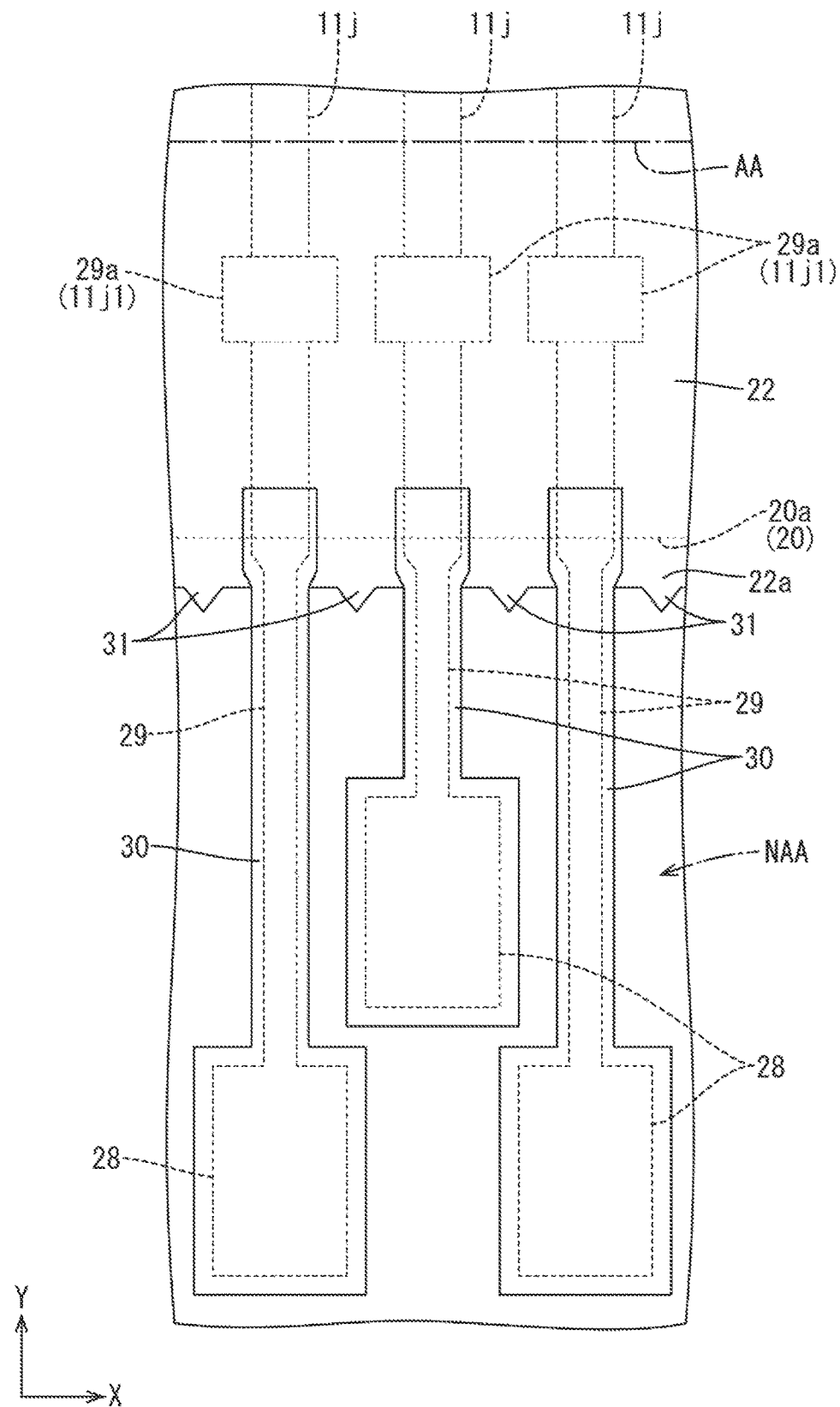
FIG. 8 is a plan view of a section of the array board in a non-display area in the liquid crystal panel.
Figure 10:
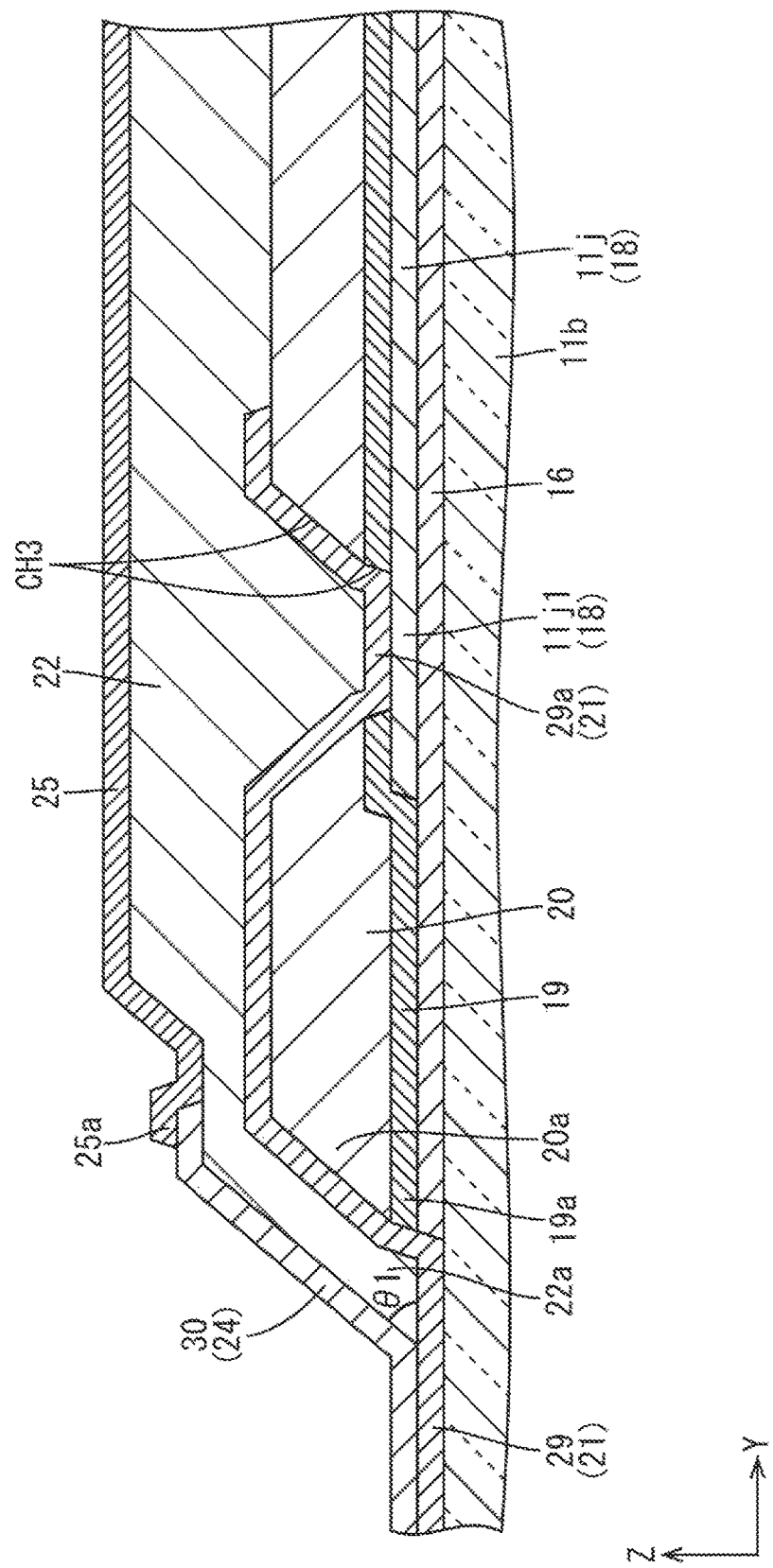
FIG. 10 is a cross-sectional view along line x-x in FIG. 9.

As illustrated in FIG. 8, the input terminals 28 are two-dimensionally arranged in a zigzag pattern in the driver 12 mounting area and connected to terminal lines 29, which will be described next. The terminal lines 29 are disposed at predefined intervals along the X-axis direction in the section of the array board 11b in the non-display area NAA. The terminal lines 29 extend in the Y-axis direction. First ends of the terminal lines 29 are connected to the input terminals 28 and second ends of the terminal lines 29 (on the display area AA side) are connected to the ends of the source lines 11j, respectively. Large sections of the source lines 11j are disposed in the display area AA but some sections of the source lines 11j (including the line overlapping sections 11j1) are disposed in the non-display area NAA. As illustrated in FIG. 10, the input terminals 28 and the terminal lines 29 are formed from the third metal film 21 that also forms the TFT connecting portions 11p. The terminal lines 29 are disposed in a layer upper than the source lines 11j to which the terminal lines 29 are connected via the first interlayer insulating film 19 and the first planarization film 20. The ends of the terminal lines 29 on an opposite side from the input terminals 28 and ends of the source lines 11j on an opposite side from the TFTs 11f are disposed to overlap each other in the plan view in the section of the array board 11b in the non-display area NAA. Overlapping sections of the source lines 11j and the terminal lines 29 are defined as line overlapping sections 11j1 and 29a. The first interlayer insulating film 19 and the first planarization film 20 disposed between the terminal lines 29 and the source lines 11j include line contact holes CH3 at positions overlapping the line overlapping sections 11j1 of the terminal lines 29 and the line overlapping sections 29a of the source lines 11j in the plan view. The line contact holes CH3 are for connecting the line overlapping sections 11j1 and 29a to each other. The signals output by the driver 12 are fed to the source electrodes 11f2 of the TFTs 11f via the input terminals 28, the terminal lines 29, and the source lines 11j.

As illustrated in FIGS. 8 and 10, sections of the insulating films 16, 19, 20, 22, and 25 closer to the driver 12 mounting area and the flexible circuit board 13 mounting area are removed in the section of the array board 11b in the non-display area NAA. Edge sections 16a, 19a, 20a, 22a, and 25a of the insulating films 16, 19, 20, 22, and 25 are disposed between the display area AA and the input terminals 28 closest to the display area AA among the terminals with respect to the Y-axis direction. Entire areas of the input terminals 28 are formed directly on the glass substrate of the array board 11b. The terminal lines 29 include sections that are formed directly on the glass substrate of the array board 11b. The rest of sections (sections on the source line 11j side) of the terminal lines 29 are formed in a layer upper than the first interlayer insulating film 19 and the first planarization film 20. Namely, the terminal lines 29 run on the first interlayer insulating film 19 and the first planarization film 20 on the way from the input terminal 28 side toward the source line 11j side. The terminal lines 29 are disposed across at least a first interlayer insulating film edge section 19a of the first interlayer insulating film 19 and a first planarization film edge section 20a of the first planarization film 20.

As illustrated in FIGS. 8 and 10, the protective members 30 are disposed to cover sections of the terminal lines 29 on the input terminal 28 side (the sections that are not on the first interlayer insulating film 19 and the first planarization film 20) not overlapping the insulating films 22 and 25 in the layers upper than the terminal lines 29. The protective members 30 are formed from the first transparent electrode film 24 that also forms the common electrode 11h. The protective members 30 cover not only the sections of the terminal lines 29 described above but also the input terminals 28. During wet-etching of the first transparent electrode film 24 performed after forming and exposure steps in a production of the array board 11b, aluminum layers of sections of the terminal lines 29 and the input terminals 28 formed from the third metal film 21 having a three-layer structure are more likely to be etched with an etching solution in comparison to titanium layers. Therefore, the aluminum layers of the sections of the terminal lines 29 and the input terminals 28 may be narrower than the titanium layers. Namely, side-shift defects may be caused. Because the sections of the terminal lines 29 and the input terminals 28 are covered with the protective members 30 as described above, the sections of the terminal lines 29 and the input terminals 28 are protected with the protective members 30 from the etching solution during the wet-etching of the first transparent electrode film 24 that are formed and exposed. Therefore, the terminal lines 29 and the input terminals 28 are less likely to have the side-shift defects.

Figure 9:
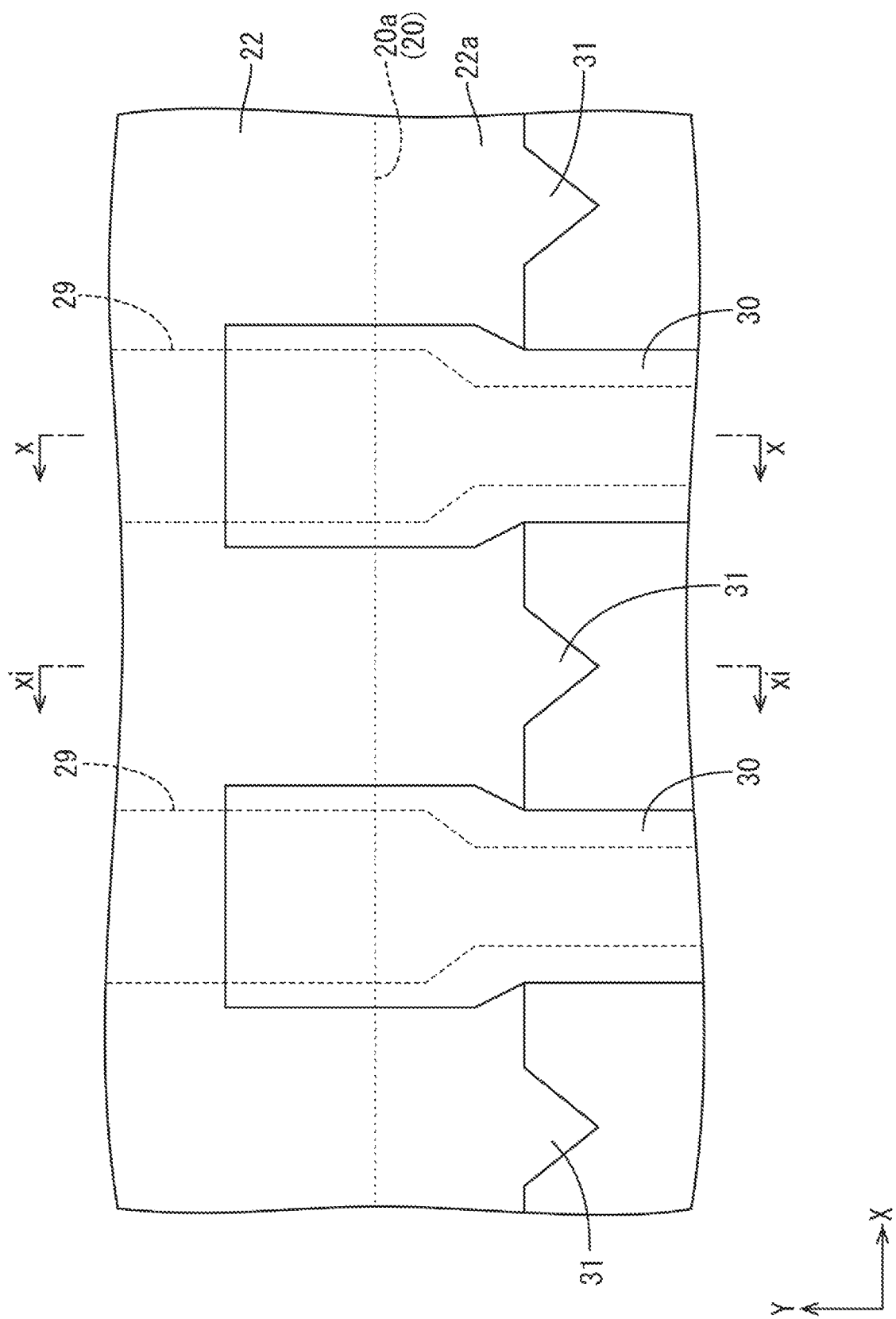
FIG. 9 is a magnified plan view of FIG. 8.

In the configuration in which the terminal lines 29 are partially disposed on the first interlayer insulating film 19 and the first planarization film 20, uneven exposure may occur during the exposure of the third metal film 21 that forms the terminal lines 29 after the formation of the third metal film 21 in the production of the array board 11b. In the step of exposing the third metal film 21, the exposure is performed with a focus on the sections of the terminal lines 29 not overlapping the first interlayer insulating film 19 and the first planarization film 20 (the sections directly formed on the glass substrate). Therefore, the sections of the terminal lines 29 overlapping the first interlayer insulating film 19 and the first planarization film 20 (the sections on the first interlayer insulating film 19 and the first planarization film 20) are out of focus. As a result, the uneven exposure occurs. As illustrated in FIG. 9, the sections of the terminal lines 29 overlapping the first interlayer insulating film 19 and the first planarization film 20 tend to be wider than the sections of the terminal lines 29 not overlapping the first interlayer insulating film 19 and the first planarization film 20. A distance between the sections of the adjacent terminal lines 29 overlapping the first interlayer insulating film 19 and the first planarization film 20 is smaller than a distance between the sections of the adjacent terminal lines 29 not overlapping the first interlayer insulating film 19 and the first planarization film 20. If the sections of the terminal lines 29 overlapping the first interlayer insulating film edge section and first planarization film edge section 20a are not covered with the second planarization film 22, residues of the first transparent electrode film 24 may be produced around the first interlayer insulating film edge section 19a and the first planarization film edge section 20a during the patterning of the first transparent electrode film 24 that forms the common electrode 11h and the protective members 30. A photo resist is disposed on the first transparent electrode film 24 for patterning the first transparent electrode film 24. The residues may result from remaining sections of the photo resist having a thickness larger overlapping the first interlayer insulating film edge section 19a and the first planarization film edge section 20a than a thickness of other sections. Therefore, the residues are produced around the first interlayer insulating film edge section 19a and the first planarization film edge section 20a. Due to the residues of the first transparent electrode film 24, the sections of the terminal lines 29 overlapping the first interlayer insulating film edge section 19a and the first planarization film edge section 20a, that is, the sections separated from each other with a smaller distance between the adjacent terminal lines 29 may be shorted.

In this embodiment, the second planarization film 22 is disposed in the layer upper than the terminal lines 29 and lower than the first transparent electrode film 24 (the protective members 30, which will be described later). As illustrated in FIGS. 9 and 10, the second planarization film edge section 22a of the second planarization film 22 is disposed closer to the input terminals 28 relative to the first interlayer insulating film edge section 19a of the first interlayer insulating film 19 and the first planarization film edge section 20a of the first planarization film 20 in the Y-axis direction (the extending direction of the terminal lines 29). According to the configuration, the sections of the terminal lines 29 overlapping the first interlayer insulating film edge section 19a and the first planarization film edge section 20a, that is, the sections separated from each other with the smaller distance between the adjacent terminal lines 29 are covered with the second planarization film 22. The sections of the terminal lines 29 overlapping the second planarization film edge section 22a do not overlap the first interlayer insulating film 19 and the first planarization film 20. Therefore, a distance between the sections of the adjacent terminal lines 29 is larger. Even if the residues of the first transparent electrode film 24 are produced in the second planarization film edge section 22a and therearound during the patterning of the first transparent electrode film 24, the residues are less likely to cause a short circuit between the sections of the terminal lines 29 overlapping the second planarization film edge section 22a.

Figure 11:
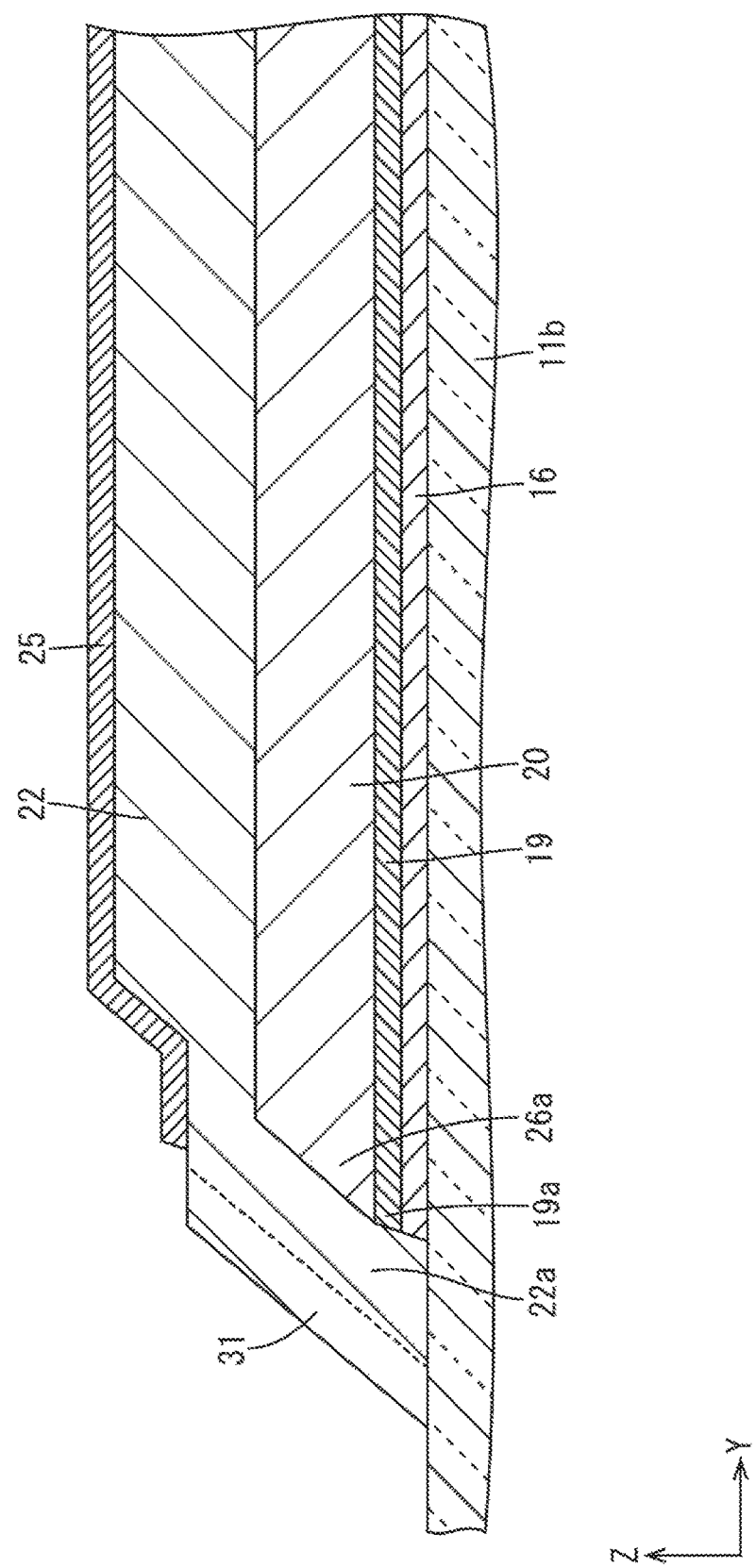
FIG. 11 is a cross-sectional view along line xi-xi in FIG. 9.

As illustrated in FIGS. 9 to 11, the second planarization film 22 includes projections 31 that are disposed between the adjacent terminal lines 29. The projections 31 project from the second planarization film edge section 22a toward the input terminal 28 side. Each projection 31 is disposed at the middle between the terminal lines 29 that are adjacent to each other in the X-axis direction. A distance between the adjacent terminal line 29 on the left in FIG. 9 and the projection 31 is about equal to a distance between the adjacent terminal line 29 on the right in FIG. 9 and the projection 31. The projections 31 and the terminal lines 29 are alternately arranged at intervals in the X-axis direction. Each projection 31 has a tapered shape in the plan view with a width that decreases as a distance from a distal end thereof in the Y-axis direction decreases (as a distance from the second planarization film edge section 22a increases). Specifically, each projection 31 has a triangular shape in the plan view. According to the configuration, a creepage distance between the adjacent terminal lines 29 at the second planarization film edge section 22a is increased by dimensions of the projections 31. Therefore, even if the residues of the first transparent electrode film 24 that forms the protective members 30 are produced in the second planarization film edge section 22a and therearound, the residues of the first transparent electrode film 24 are less likely to be produced across areas between the adjacent terminal lines 29.

As illustrated in FIGS. 9 to 11, the projections 31 are included in the second planarization film 22 disposed in a layer upper than the terminal lines 29. The protective members 30 are formed from the first transparent electrode film 24 disposed in the layer upper than the second planarization film 22. Therefore, the projections 31 and the protective members 30 are positioned relative to the terminal lines 29 with high accuracy. Reasons for that are as follows. As illustrated in FIG. 7, the common electrode 11h that is formed from the first transparent electrode film 24 that also forms the protective members 30 includes holes OP that are aligned (or positioned) relative to the TFT connecting portions 11p that are formed in the layer in which the terminal lines 29 are disposed and from the third metal film 21 with respect to the X-axis direction and the Y-axis direction. The second planarization film 22 including the projections 31 and the second interlayer insulating film 25 include second TFT contact holes CH2 that communicate with each other. The second TFT contact holes CH2 are aligned with the TFT connecting portions 11p that are disposed in the layer in which the terminal lines 29 are disposed and formed from the third metal film 21 with respect to the X-axis direction and the Y-axis direction. The projections 31 included in the second planarization film 22 and the protective members 30 that cover the terminal lines 29 are positioned relative to the respective terminal lines 29 with high accuracy with respect to the X-axis direction and the Y-axis direction. Therefore, the short circuit between the adjacent terminal lines 29 is further less likely to occur.

In the production of the array board 11b, the first planarization film 20 is formed after the first interlayer insulating film 19 is formed. The first planarization film 20 is patterned (exposed and developed) and the first interlayer insulating film 19 is patterned (or etched) using the patterned first planarization film 20 as a mask (see FIG. 10). As illustrated in FIG. 10, an angle of slope of the first interlayer insulating film edge section 19a of the first interlayer insulating film 19 is larger than an angle of slope of the first planarization film edge section 20a of the first planarization film 20 in the array board 11b produced in the production processes described above. In a configuration in which the first interlayer insulating film edge section 19a is not covered with the second planarization film 22, the residues of the first transparent electrode film 24 may be more likely to be produced due to the first interlayer insulating film edge section 19a. However, the second planarization film edge section 22a of the second planarization film 22 is disposed closer to the input terminals 28 relative to the first interlayer insulating film edge section 19a and the first planarization film edge section 20a. The first interlayer insulating film edge section 19a and the first planarization film edge section 20a are covered with the second planarization film 22. Therefore, the residues of the first transparent electrode film 24 are less likely to be produced at the first interlayer insulating film edge section 19a and thus the residues are less likely to cause the short circuit between the adjacent terminal lines 29.

This embodiment has the configuration described above. Next, functions and operation of this embodiment will be described. The liquid crystal display device 10 according to this embodiment has the position input function. Therefore, the user of the liquid crystal display device 10 can input a position based on an image displayed in the display area AA of the liquid crystal panel 11. The common electrode 11h included in the array board 11b of the liquid crystal panel 11 is also the position detection electrodes 27. A common voltage (a reference voltage) which is a reference to voltages at the pixel electrodes 11g is applied to the common electrode 11h by the driver 12 for image display. A voltage for obtaining an electrostatic capacitance between the common electrode 11h and the finger is applied by the driver 12 for position detection. Namely, the driver 12 controls the driving of the liquid crystal panel 11 differently in a display period and a position detection period per unit period.

In the display period, the driver 12 supplies scan signals to the gate lines 11i, data signals (image signals) to the source lines 11j, and common voltage signals to the position detection lines 11q. As illustrated in FIGS. 4 and 8, the data signals output by the driver 12 are transmitted to the source lines 11j via the input terminals 28 and the terminal lines 29. When the TFTs 11f in a row selected based on the scan signals supplied to the gate lines 11i are turned on, voltages corresponding to the data signals supplied to the source lines 11j are applied to the pixel electrodes 11g via the channels 11f4 of the TFTs 11f. The common voltage is simultaneously applied to the common electrode segments 11hS of the common electrode 11h according to the common voltage signals supplied to the position detection lines 11q. Based on differences in voltage between the pixel electrodes 11g and the common electrode 11h, the pixels PX exhibit specified tones and thus a specified image is displayed in the display area AA of the liquid crystal panel 11.

In the position detection period, the driver 12 supplies position detection driving signals to the position detection lines 11q. If position input in the display area AA of the liquid crystal panel 11 is performed by the user of the liquid crystal display device 10 with his or her finger, an electrostatic capacitance is obtained between the finger and the position detection electrode 27 close to the finger. Namely, the electrostatic capacitance at the position detection electrode 27 closer to the finger is larger than the electrostatic capacitance at the position detection electrode 27 farther from the finger because the position detection electrode 27 closer to the finger and the finger have the electrostatic capacitance therebetween. When the electrostatic capacitances at the position detection electrodes 27 are detected by the driver 12 via the position detection lines 11q, the driver 12 extracts the capacitance that has varied from the detected electrostatic capacitances. The driver 12 obtains position information regarding the input position based on the position detection line 11q that has transmitted the electrostatic capacitance that has varied. As a result, the position input by the user with his or her finger can be detected.

As described above, the array board 11b (the display board) in this embodiment includes the display area AA in which images are displayed, the non-display area NAA, the input terminals 28 (the terminals), the first interlayer insulating film 19, the first planarization film 20 (the first insulating film), the terminal lines 29, the second planarization film 22 (the second insulating film), and the protective members 30. The non-display area NAA is located outside the display area AA to surround the display area AA. The input terminals 28 are disposed in the non-display area NAA. The first interlayer insulating film 19 and the first planarization film 20 are disposed to cross the boundary between the display area AA and the non-display area NAA such that the first interlayer insulating film edge section 19a and the first planarization film edge section 20a (the first insulating film edge section) are disposed between the input terminals 28 and the display area AA. The terminal lines 29 are disposed in the layer upper than the first interlayer insulating film 19 and the first planarization film 20 to cross the first interlayer insulating film edge section 19a and the first planarization film edge section 20a in at least the non-display area NAA and connected to the input terminals 28. The second planarization film 22 is disposed in the layer upper than the terminal lines 29 to cross the boundary between the display area AA and the non-display area NAA such that the second planarization film edge section 22a (the second insulating film edge section) is disposed closer to the input terminals 28 relative to the first interlayer insulating film edge section 19a and the first planarization film edge section 20a. The protective members 30 are disposed in the layer upper than the second planarization film 22 at least in the non-display area NAA. The protective members 30 are formed from the first transparent electrode film 24 (the transparent electrode film). The protective members 30 cover the sections of the terminal lines not overlapping the second planarization film 22.

The terminal lines 29 connected to the input terminals 28 disposed in the non-display area NAA are disposed in the layer upper than the first interlayer insulating film 19 and the first planarization film 20 to cross the first interlayer insulating film edge section 19a and the first planarization film edge section 20a disposed between the input terminals 28 and the display area AA. The sections of the terminal lines 29 not overlapping the second planarization film 22 disposed in the upper layer are covered with the protective members 30 that are formed from the first transparent electrode film 24 and disposed in the layer upper than the second planarization film 22 and protected. In the sections of the terminal lines 29 overlapping the first interlayer insulating film 19 and the first planarization film 20, uneven exposure is more likely to occur during the exposure performed for patterning in comparison to the section of the terminal lines 29 not overlapping the first interlayer insulating film 19 and the first planarization film 20. Therefore, the width of the sections of the terminal lines 29 overlapping the first interlayer insulating film 19 and the first planarization film 20 may be larger. The distance between the sections of the adjacent terminal lines 29 which overlap the first interlayer insulating film 19 and the first planarization film 20 may be smaller than the distance between the sections of the adjacent terminal lines 29 which do not overlap the first interlayer insulating film 19 and the first planarization film 20. In the configuration in which the sections of the terminal lines 29 overlapping the first interlayer insulating film edge section 19a and the first planarization film edge section 20a are not covered with the second planarization film 22, the residues of the first transparent electrode film 24 are more likely to be produced around the first interlayer insulating film edge section 19a and the first planarization film edge section 20a during the patterning the first transparent electrode film 24 to form the protective members 30. The residues may case a short circuit between the sections of the terminal lines 29 overlapping the first interlayer insulating film edge section 19a and the first planarization film edge section 20a, that is, the sections of the terminal lines 29 between which the distance is smaller.

Because the second planarization film edge section 22a of the second planarization film 22 is disposed closer to the input terminals 28 relative to the first interlayer insulating film edge section 19a and the first planarization film edge section 20a, the sections of the terminal lines 29 overlapping the first interlayer insulating film edge section 19a and the first planarization film edge section 20a, that is, the sections of the terminal lines 29 between which the distance is smaller are covered with the second planarization film 22. The sections of the terminal lines 29 overlapping the second planarization film edge section 22a do not overlap the first interlayer insulating film 19 and the first planarization film 20. Therefore, the distance between the adjacent terminal lines 29 is larger. Even if the residues of the first transparent electrode film 24 are produced in the second planarization film edge section 22a and therearound during the patterning of the first transparent electrode film 24, the residues are less likely to cause the short circuit between the sections of the terminal lines 29 overlapping the second planarization film edge section 22a.

The second planarization film 22 includes the projections 31 that project from the second planarization film edge section 22a toward the input terminal 28 side between the adjacent terminal lines 29. According to the configuration, the creepage distance between the adjacent terminal lines 29 at the second planarization film edge section 22a is increased by dimensions of the projections 31. Therefore, even if the residues of the first transparent electrode film 24 that forms the protective members 30 are produced in the second planarization film edge section 22a and therearound, the residues of the first transparent electrode film 24 are less likely to be produced across the areas between the adjacent terminal lines 29. Furthermore, the projections 31 are included in the second planarization film 22 that is disposed in the layer upper than the terminal lines 29. Therefore, the projections 31 can be positioned relative to the terminal lines 29 with high accuracy. The reason why such high accuracy can be achieved is that an insulating film is usually patterned with alignment with lines formed form a metal film disposed in a layer lower than the insulating film. According to the configuration, higher reliability can be achieved in short-circuit protection between the adjacent terminal lines 29.

The array board 11b further includes the TFTs 11f (the display components), the TFT connecting portions 11p (the component connecting portions), the common electrode 11h, the second interlayer insulating film 25 (the third insulating film), and the pixel electrodes 11g. The TFTs 11f are disposed in the display area AA. The TFT connecting portions 11p are disposed in the layer upper than the first interlayer insulating film 19 and the first planarization film 20 in the display area AA and connected to the TFTs 11f. The TFT connecting portions 11p are disposed in the layer in which the terminal lines 29 are disposed. The common electrode 11h is disposed in the layer upper than the second planarization film 22 in the display area AA. The common electrode 11h includes the holes OP at the positions overlapping the TFT connecting portions 11p. The common electrode 11h is formed from the first transparent electrode film 24 that also forms the protective members 30. The second interlayer insulating film 25 is disposed in the layer upper than the common electrode 11h at least in the display area AA. The second interlayer insulating film 25 includes the second TFT contact holes CH2 (the component contact holes) at the positions overlapping the TFT connecting portions 11p to communicate with the second planarization film 22. The pixel electrodes 11g are disposed in the layer upper than the second interlayer insulating film 25 in the display area AA and connected to the TFT connecting portions 11p via the second TFT contact holes CH2. The pixel electrodes 11g are formed from the second transparent electrode film 26. According to the configuration, the pixel electrodes 11g are connected to the TFT connecting portions 11p via the second TFT contact holes CH2 of the second interlayer insulating film 25 and the second planarization film 22 which are communicate with each other. The pixel electrodes 11g are connected to the TFTs 11f via the TFT connecting portions 11p. The pixel electrodes 11g are disposed to overlap the common electrode 11h via the second interlayer insulating film 25. The difference in voltage is produced between the common electrode 11h and the pixel electrodes 11g according to the application of the voltage by the TFT 11f. The display with the specified tones can be performed based on the difference in voltage. The common electrode 11h includes the holes OP at the positions overlapping the TFT connecting portions 11p. Therefore, a short circuit is less likely to occur between the common electrode 11h and the pixel electrodes 11g. The common electrode 11h is formed by patterning the first transparent electrode film 24 that also forms the protective members 30. The terminal lines are covered with the protective members 30 and protected. Therefore, deterioration of the terminal lines 29, which may occur during the patterning, is less likely to occur during the patterning.

The holes OP of the common electrode 11h formed from the first transparent electrode film 24 that also forms the protective members 30 need to be aligned with the TFT connecting portions 11p in the layer in which the terminal lines 29 are disposed. The second TFT contact holes CH2 of the second planarization film 22 and the second TFT contact holes CH2 of the second interlayer insulating film 25, which are communicate with each other, need to be aligned with the TFT connecting portions 11p in the layer in which the terminal lines 29 are disposed. Therefore, the projections 31 of the second planarization film 22 and the protective members 30 are positioned relative to the terminal lines 29 with high accuracy. Further higher reliability can be achieved in short-circuit protection between the adjacent terminal lines 29.

The common electrode 11h is also used as the position detection electrodes 27. Each position detection electrode 27 and a position input object to input a position create an electric field therebetween. Namely, the array board 11b has the position input function.

The array board 11b further includes the TFTs 11f disposed in the display area AA and the source lines 11j (the component lines) disposed in the layer lower than the first interlayer insulating film 19 and the first planarization film 20 in at least the display area AA and connected to the TFTs 11f. The terminal lines 29 include the line overlapping sections 29a and the source lines 11j include the line overlapping sections 11j1. The line overlapping sections 29a and the line overlapping sections 11j1 overlap each other in the non-display area NAA. The first interlayer insulating film 19 and the first planarization film 20 include the line contact holes CH3 at positions overlapping the line overlapping sections 11j1 and 29a for connecting the line overlapping sections 11j1 and 29a to each other. The line overlapping sections 11j1 of the source lines 11j that are in the layer lower than the first interlayer insulating film 19 and the first planarization film 20 are connected to the line overlapping sections 29a of the terminal lines 29 that are in the layer upper than the first interlayer insulating film 19 and the first planarization film 20 via the line contact holes CH3 of the first interlayer insulating film 19 and the first planarization film 20. The terminal lines 29 cross the first interlayer insulating film edge section 19a of the first interlayer insulating film 19 and the first planarization film edge section 20a of the first planarization film 20. The terminal lines 29 are connected to the input terminals 28. Therefore, the residues of the first transparent electrode film 24 may cause a short circuit between the adjacent terminal lines 29. Because the second planarization film edge section 22a of the second planarization film 22 is located closer to the input terminals 28 relative to the first interlayer insulating film edge section 19a and the first planarization film edge section 20a, a short circuit between the adjacent terminal lines 29 due to the residues of the first transparent electrode film 24 is less likely to occur.

The first insulating film in the layer lower than the second planarization film 22 includes the first interlayer insulating film 19 (the lower-side first insulating film) and the first planarization film 20 (the upper-side first insulating film) in the layer upper than the first interlayer insulating film 19. In the first insulating film disposed in the layer lower than the second planarization film 22 and having the two-layer structure including the first interlayer insulating film 19 and the first planarization film 20, when the first interlayer insulating film 19 is patterned using the first planarization film 20 as a mask, the angle of slope of the first interlayer insulating film 19 at the first insulating film edge section tends to be larger than the angle of slope of the first planarization film 20 at the first insulating film edge section. Therefore, the residues of the first transparent electrode film 24 may be produced at the first interlayer insulating film edge section 19a. Because the second planarization film edge section 22a of the second planarization film 22 is located closer to the input terminals 28 relative to the first interlayer insulating film edge section 19a and the first planarization film edge section 20a, the residues of the first transparent electrode film 24 is less likely to cause a short circuit.

The liquid crystal panel 11 (the display panel) according to this embodiment includes the array board 11b described above and the CF board 11a (the common board) opposed to the array board 11b. According to the liquid crystal panel 11 having such a configuration, higher reliability can be achieved in short-circuit protection of the array board 11b. Therefore, higher operation reliability can be achieved.

<Second Embodiment>

A second embodiment of the present invention will be described with reference to FIGS. 12 to 15. The second embodiment includes a second planarization film 122 having a configuration different from that of the first embodiment. Configurations, functions, and effects similar to those of the first embodiment will not be described.

Figure 12:
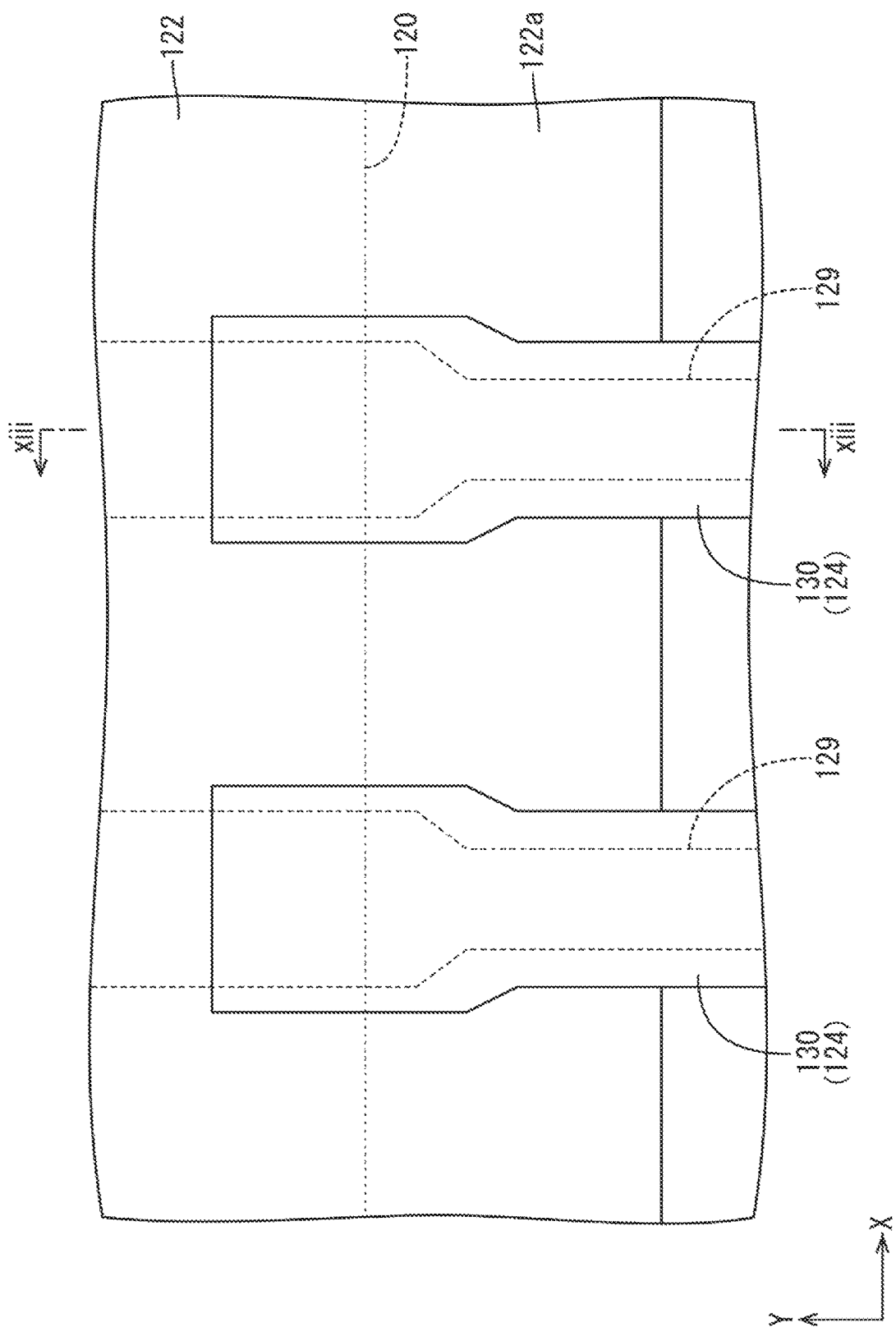
FIG. 12 is a magnified plan view schematically illustrating a wiring configuration of an array board in a non-display area included in a liquid crystal panel according to a second embodiment of the present invention.
Figure 13:
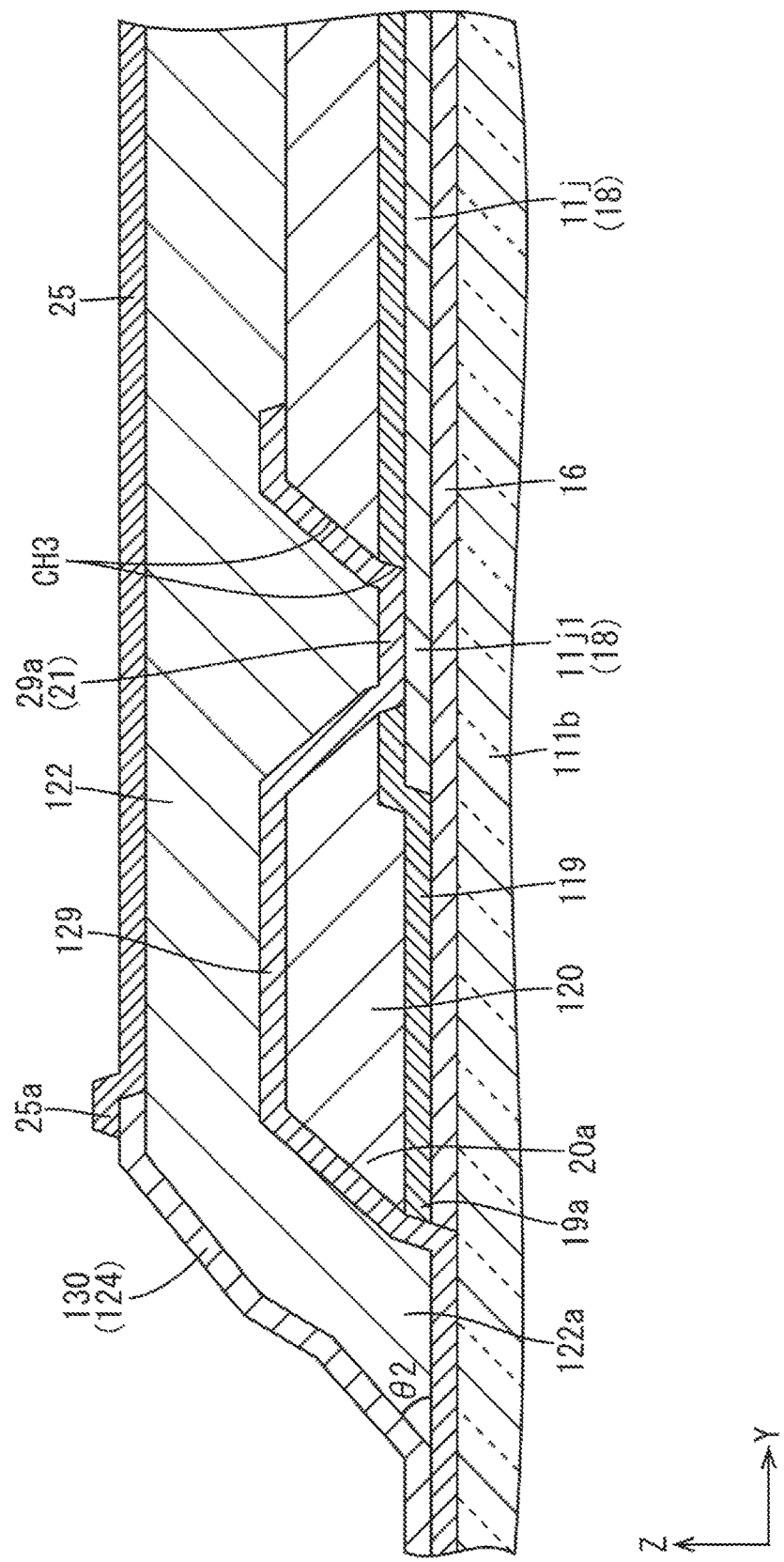
FIG. 13 is a cross-sectional view along line xiii-xiii in FIG. 12.

As illustrated in FIGS. 12 and 13, the second planarization film 122 in this embodiment includes sections that do not overlap a first interlayer insulating film 119 and a first planarization film 120 and sections that overlap the first interlayer insulating film 119 and the first planarization film 120. The thickness of the sections that do not overlap the first interlayer insulating film 119 and the first planarization film 120 is smaller than the thickness of the sections that overlap the first interlayer insulating film 119 and the first planarization film 120. The sections of the second planarization film 122 not overlapping the first interlayer insulating film 119 and the first planarization film 120 include a second planarization film edge section 122a. An angle θ2 of slope of the second planarization film edge section 122a is smaller than the angle θ1 of slope of the second planarization film edge section 22a (see FIG. 10) in the first embodiment. During patterning of a first transparent electrode film 124 to form protective members 130 in a production of an array board 111b, residues of the first transparent electrode film 124 are less likely to be produced around the second planarization film edge section 122a. Therefore, further higher reliability can be achieved in short-circuit protection between adjacent terminal lines 129. This embodiment has such a configuration and the projections 31 (see FIG. 9) in the first embodiment are omitted.

Figure 14:
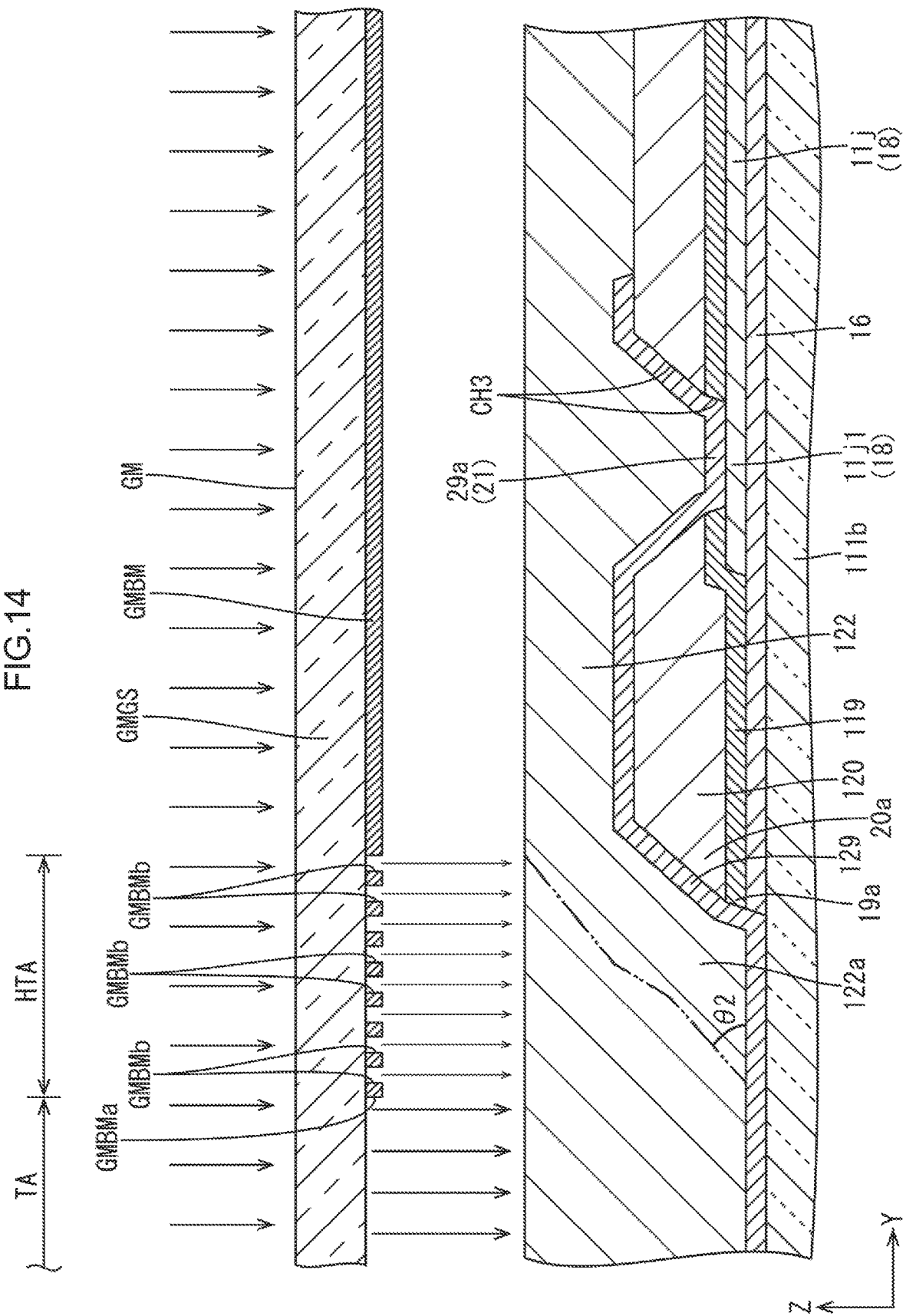
FIG. 14 is a cross-sectional view illustrating an exposing process for exposing a second planarization film with a gray tone mask in a production of the array board included in the liquid crystal panel.

The thickness of the second planarization film 122 changes stepwise. The second planarization film 122 having two thicknesses is formed in the production of the array board 111b as follows. A method of producing the array board 111b includes a second planarization film forming process for forming the second planarization film 122. The second planarization film forming process includes a film forming step, an exposing step, and a developing step. The film forming step is for forming the second planarization film 122 made of a positive-type photosensitive material in a solid pattern. The exposing step is for exposing the second planarization film 122 formed in the solid pattern with a gray tone mask GM that is a photomask. The developing step is for developing the second planarization film 122 that has been exposed. As illustrated in FIG. 14, the gray tone mask GM used in the exposing step includes a transparent glass base GMGS and a light blocking film GMBM formed on the glass base GMGS. The light blocking film GMBM blocks light rays from an exposing light source. The light blocking film GMBM includes hole GMBMa and slits GMBMb. The hole GMBMa is larger than resolution of the exposing device and the slits GMBMb are smaller than the resolution of the exposing device. The light blocking film GMBM is formed at a position overlapping a position at which a section of the second planarization film 122 in the solid pattern overlapping the first interlayer insulating film 119 and the first planarization film 120 to be formed. The holes GMBMa is formed at a position not overlapping the second planarization film 122 after patterning of the second planarization film 122 (a section closer to the input terminals relative to the second planarization film edge section 122a). Similar holes are formed at positions overlapping sections in which the second TFT contact holes (see FIGS. 6 and 7) are to be formed, which are not illustrated. The hole GMBMa is referred to as a transmissive area TA having transmissivity of 100% to pass the exposing light. The slits GMBMb are formed at positions overlapping a section of the second planarization film 122 in the solid pattern not overlapping the first interlayer insulating film 119 and the first planarization film 120 to be formed (a section including the second planarization film edge section 122a). The slits GMBMb are formed in the area adjacent to the hole GMBMa on a display area AA side with respect to the Y-axis direction. The slits GMBMb are arranged at intervals. The slits GMBMb are referred to as a semitransmissive area HTA having transmissivity of 10% to 70% to pass the exposing light.

Figure 15:
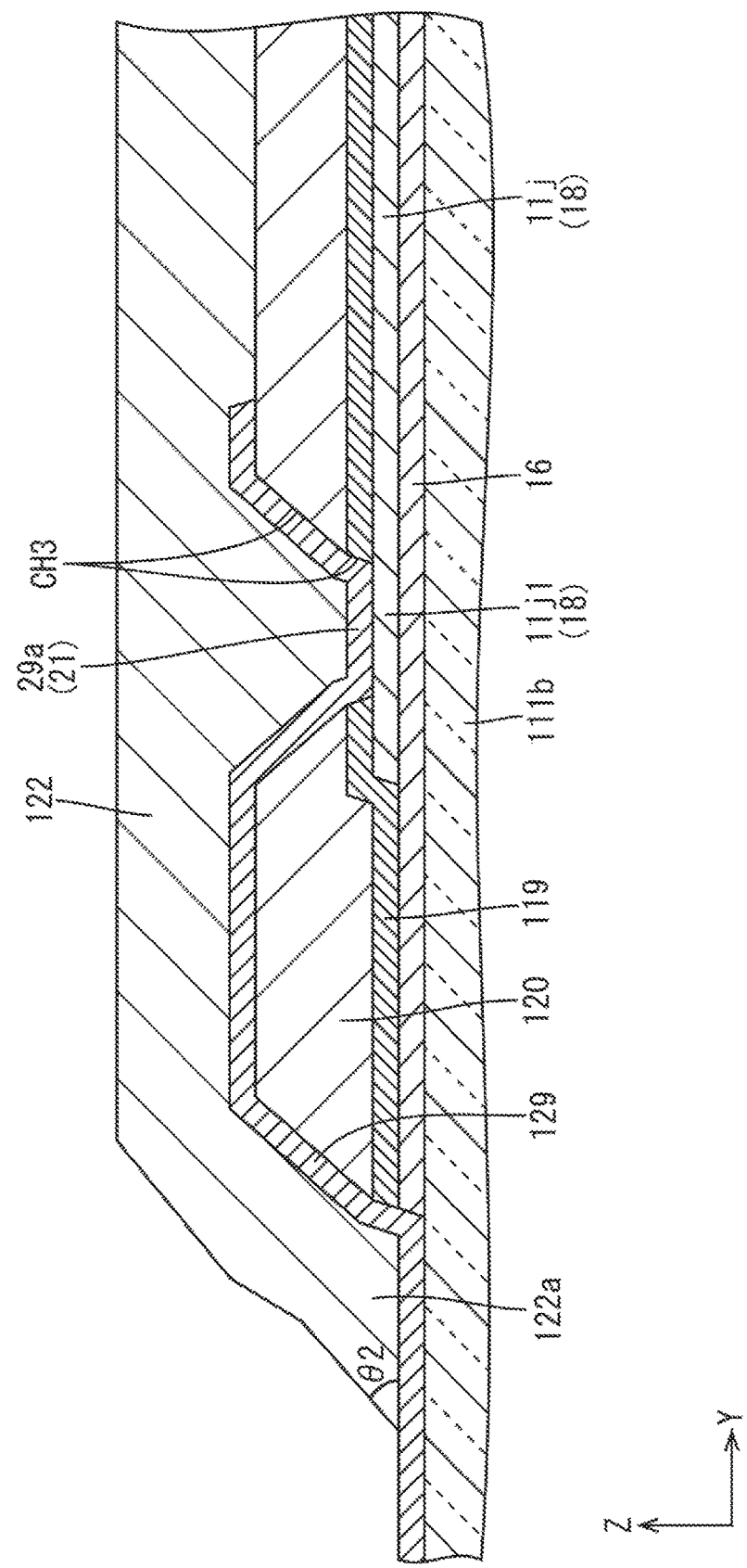
FIG. 15 is a cross-sectional view illustrating a developing process for developing the second planarization film in the production of the array board included in the liquid crystal panel.

In the exposing step that uses the grey tone mask GM having such a configuration, when an ultraviolet ray, which is the light from the exposing light source, is applied to the second planarization film 122 in the solid pattern with the gray tone mask GM, an amount of applied light is larger in the section of the second planarization film 122 overlapping the hole GMBMa (the transmissive area TA) and an amount of applied light is smaller in the section of the second planarization film 122 overlapping the slits GMBMb (the semitransmissive area HTA). When the developing step is performed afterward, as illustrated in FIG. 15, the thickness of the section of the second planarization film 122 not overlapping the first interlayer insulating film 119 and the first planarization film 120 is smaller and the thickness of the section of the second planarization film 122 overlapping the first interlayer insulating film 119 and the first planarization film 120 is larger. In a single exposing step, the second planarization film 122 including the sections with different thicknesses can be formed. Therefore, production time can be reduced.

As described above, according to this embodiment, the section of the second planarization film 122 not overlapping the first interlayer insulating film 119 and the first planarization film 120 has the thickness smaller than the thickness of the section of the second planarization film 122 overlapping the first interlayer insulating film 119 and the first planarization film 120. According to the configuration, an angle of slope of the second planarization film edge section 122a, which is the section of the second planarization film 122 overlapping the first interlayer insulating film 119 and the first planarization film 120 is smaller. Therefore, the residues of the first transparent electrode film 124 are less likely to be produced around the second planarization film edge section 122a. Further higher reliability can be achieved in short-circuit protection between the adjacent terminal lines 129.

<Third Embodiment>

A third embodiment of the present invention will be described with reference to FIGS. 16 to 18. The third embodiment is a combination of the first embodiment and the second embodiment. Configurations, functions, and effects similar to those of the first and the second embodiments will not be described.

Figure 16:
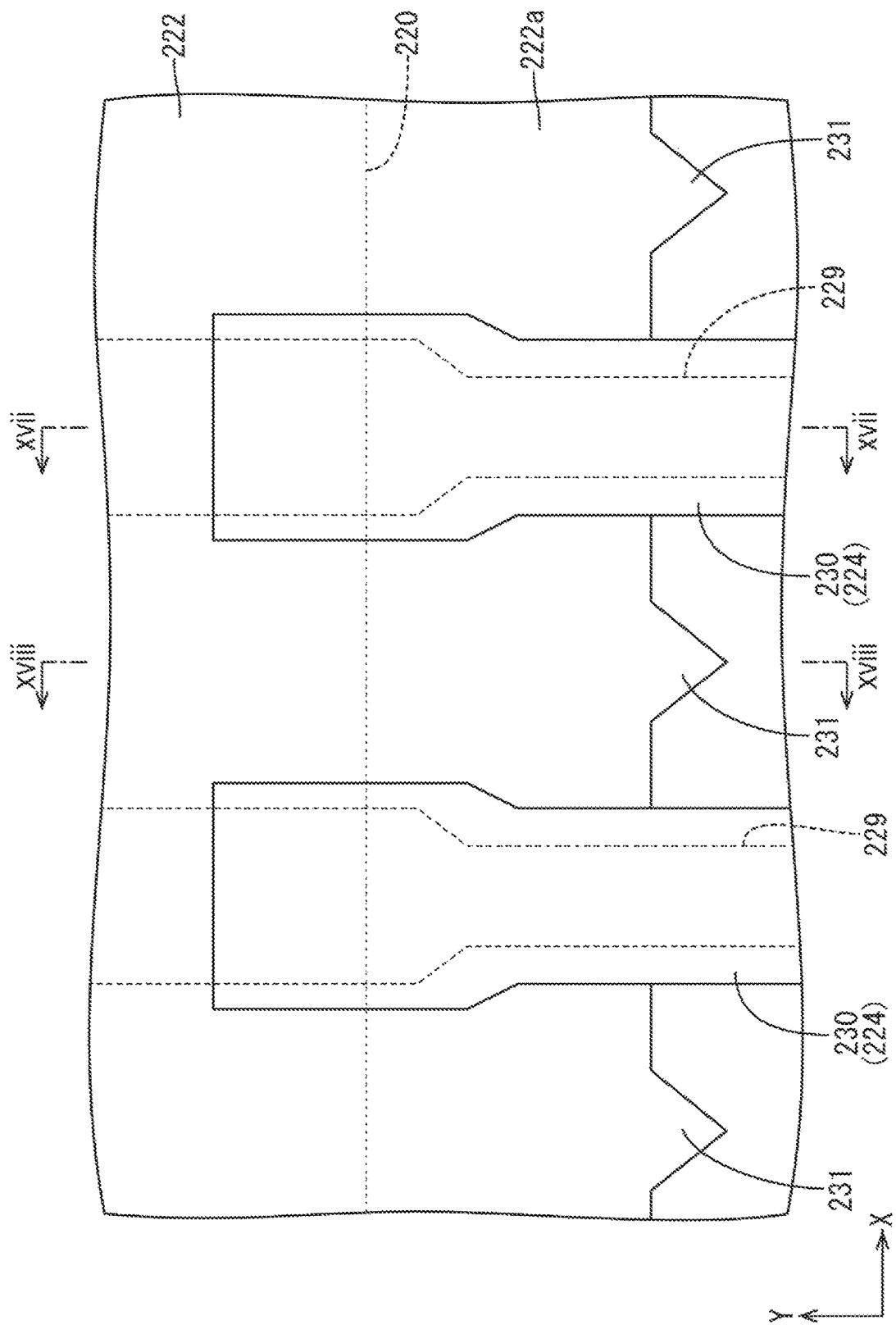
FIG. 16 is a magnified plan view schematically illustrating a wiring configuration of an array board in a non-display area included in a liquid crystal panel according to a third embodiment of the present invention.
Figure 17:
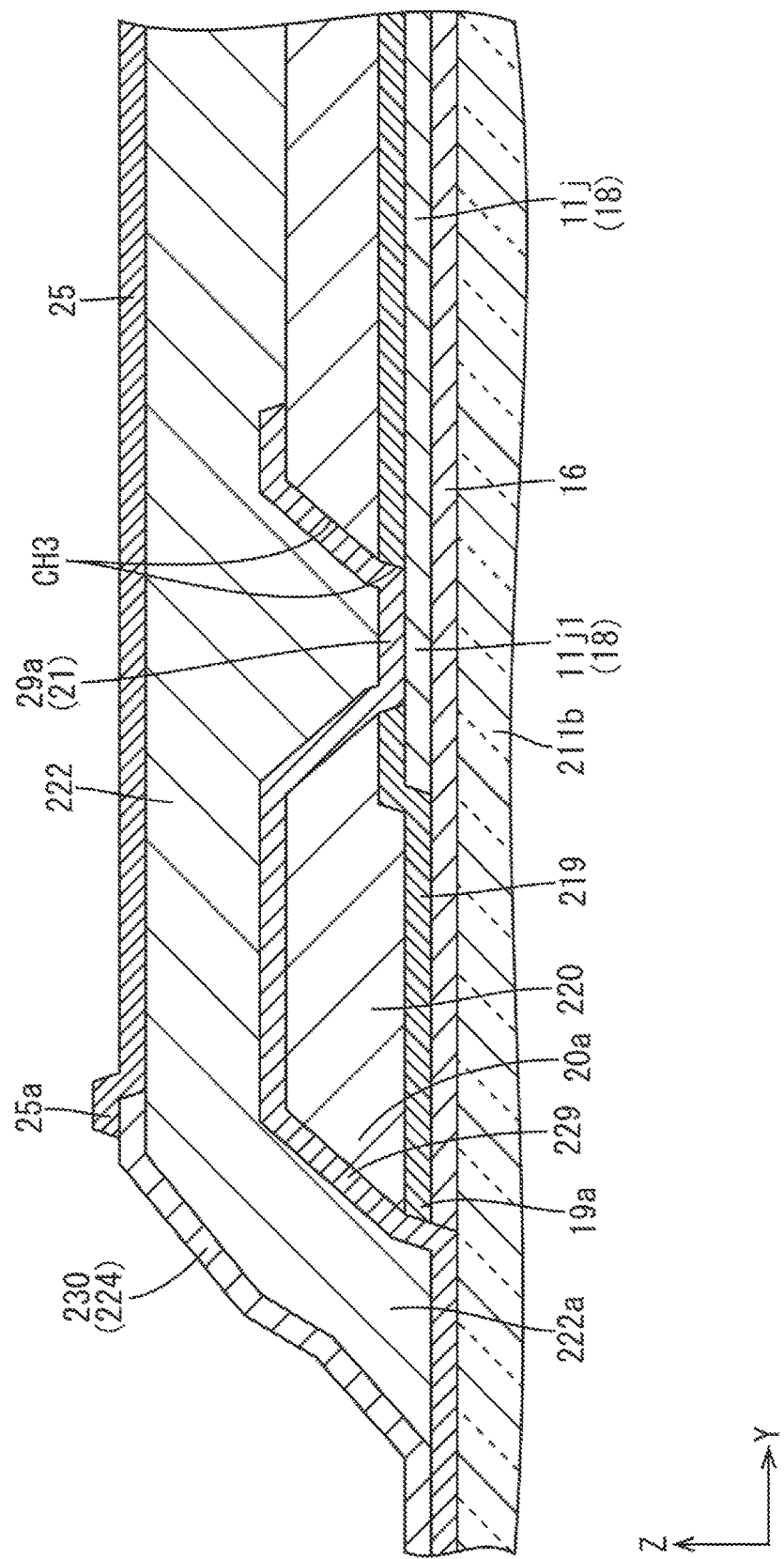
FIG. 17 is a cross-sectional view along line xvii-xvii in FIG. 16.
Figure 18:
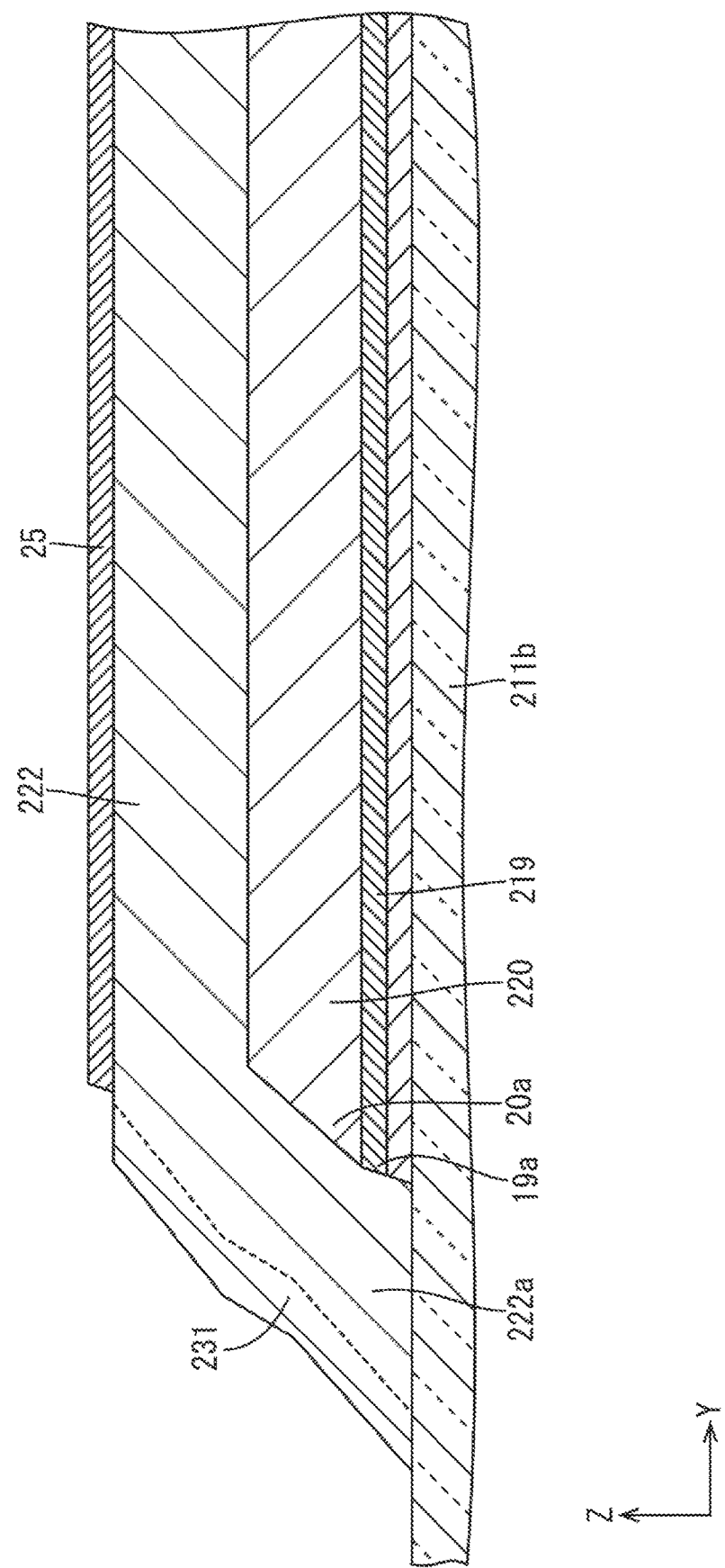
FIG. 18 is a cross-sectional view along line xviii-xviii in FIG. 16.

As illustrated in FIGS. 16 to 18, a second planarization film 222 in this embodiment includes projections 231 disposed between adjacent terminal lines 229 and projecting from a second planarization film edge section 222a toward a input terminal side. The second planarization film 222 further includes a section that does not overlap a first interlayer insulating film 219 and a first planarization film 220 having a thickness smaller than a thickness of a section that overlap the first interlayer insulating film 219 and the first planarization film 220. The section of the second planarization film 222 not overlapping the first interlayer insulating film 219 and the first planarization film 220 includes a section that includes the second planarization film edge section 222a and the projections 231. Therefore, angles of slopes of the second planarization film edge section 222a and the projections 231 are smaller. During patterning of a first transparent electrode film 224 to form protective members 230 in a production of an array board 211b, residues of the first transparent electrode film 224 are less likely to be produced around the second planarization film edge section 222a and the projections 231. Therefore, further higher reliability can be achieved in short-circuit protection between the adjacent terminal lines 229.

<Fourth Embodiment>

A fourth embodiment will be described with reference to FIG. 19. The fourth embodiment includes an exposing step in which a halftone mask HM is used as a photomask instead of the photomask used in the second embodiment. Configurations, functions, and effects similar to those of the second embodiment will not be described.

A method of producing an array board 311b according to this embodiment includes a second planarization film forming process. The second planarization film forming process includes a film forming step in which a second planarization film 322 is formed from a positive-type photosensitive material and an exposing step in which the halftone mask HM is used as a photomask. As illustrated in FIG. 19, the halftone mask HM includes a transparent glass base HMGS, a light blocking film HMBM, and a semitransmissive film HMHT. The light blocking film HMBM is formed on a plate surface of the glass base HMGS to block light from an exposing light source. The semitransmissive film HMHT pass the light from the exposing light source with a predefined transmissivity. The transmissivity of the light blocking film HMBM to pass the light is about 0%. The light blocking film HMBM includes a hole HMBMa at a position overlapping a section of the second planarization film 322 in the solid pattern overlapping a first interlayer insulating film 319 and a first planarization film 320 to be formed. The semitransmissive film HMHT is formed on the light blocking film HMBM on an opposite side from a glass base HMGS side. The semitransmissive film HMHT has transmissivity of about 10% to 70% to pass the light. The semitransmissive film HMHT includes a hole HMHTa at a position not overlapping the second planarization film 322 after patterning (a section closer to the input terminals relative to a second planarization film edge section 322a). Namely, in a section of the glass base HMGS of the halftone mask HM overlapping the section of the second planarization film 322 not overlapping the first interlayer insulating film 319 and the first planarization film 320 to be formed (the section including the second planarization film edge section 322a), the light blocking film HMBM is not formed but the semitransmissive film HMHT is formed. This section is referred to as a semitransmissive area HTA having the transmissivity of about 10% to 70% to pass the light. The half transmissive area HTA is an area of the hole HMBMa of the light blocking film HMBM not overlapping the hole HMHTa of the semitransmissive film HMHT. The hole HMHTa of the semitransmissive film HMHT is referred to as a transmissive area TA having transmissivity of about 100% to pass the light.

In the exposing step that uses the halftone mask HM having such a configuration, when an ultraviolet ray, which is the light from the exposing light source, is applied to the second planarization film 322 in the solid pattern with the halftone mask HM, an amount of applied light is larger in the section of the second planarization film 322 overlapping the hole HMHTa (the transmissive area TA) of the semitransmissive film HMHT and an amount of applied light is smaller in the section of the hole HMBMa of the light blocking film HMBM not overlapping the hole HMHTa of the semitransmissive film HMHT (the semitransmissive area HTA). When the developing step is performed afterward, the thickness of the section of the second planarization film 322 not overlapping the first interlayer insulating film 319 and the first planarization film 320 is smaller and the thickness of the section of the second planarization film 322 overlapping the first interlayer insulating film 319 and the first planarization film 320 is larger. In a single exposing step, the second planarization film 322 including the sections with different thicknesses can be formed. Therefore, production time can be reduced.

<Other Embodiments>

The present invention is not limited to the above embodiments described in the above sections and the drawings. For example, the following embodiments may be included in technical scopes of the present invention.

(1) In each of the above embodiment sections, the terminal lines are formed from the third metal film that also forms the TFT connecting portions. However, the terminal lines may be formed from the fourth metal film that also forms the position detection lines, the terminal lines may be formed from the second metal film that also forms the source lines, or the terminal lines may be formed from the first metal film that also forms the gate lines.

(2) In each of the above embodiments, the terminal lines are connected to the source lines. However, the terminal lines may be connected to the lines other than the source lines such as the gate lines and the position detection lines.

(3) In each of the above embodiments, the first interlayer insulating film is disposed in the layer lower than the first planarization film. However, the first interlayer insulating film may be omitted.

(4) In each of the above embodiments (except for the second embodiment), each projection of the second planarization film has the triangular shape in the plan view. However, each projection may have a shape other than the triangular shape in the plan view such as a trapezoidal shape, a circular shape (a semicircular shape), an oval shape (a semi-oval shape), a quadrilateral shape, and a polygonal shape having five or more corners.

(5) As a modification of the second to the fourth embodiments, a negative-type photosensitive material may be used for the second planarization film. In this modification, the transmissive area of the halftone mask or the gray tone mask may be disposed at a position overlapping the section of the second planarization film overlapping the first interlayer insulating film and the first planarization film to be formed.

(6) In each of the above embodiments, the position input is performed by the finger of the user. However, the position input may be performed by a position input device other than the finger such as a stylus.

(7) In each of the above embodiments, the position detection electrodes and the common electrode are unified. However, the position detection electrode may be provided separately from the common electrode.

(8) In each of the above embodiment sections, the in-cell type liquid crystal panel including the touchscreen pattern (e.g., the position detection electrodes and the position detection lines) is embedded in the liquid crystal panel is described. However, the liquid crystal panel may be an on-cell type display panel or an out-cell type display panel. Specifically, the out-cell type liquid crystal panel may not have the position detection function (the touchscreen pattern).

(9) In each of the above embodiment sections, the liquid crystal display device having the position detection function (the touchscreen pattern). However, the present invention may be applied to liquid crystal display devices that do not have the position detection function.

(10) In each of the above embodiments, the liquid crystal panel has the rectangular shape in the plan view. However, the present invention may be applied to liquid crystal panels having quadrilateral shapes, circular shapes, and overall shapes in the plan view.

(11) In each of the above embodiments, the driver is COG-mounted on the array board of the liquid crystal panel. However, the driver may be chip-on-film (COF) mounted on the liquid crystal panel flexible circuit board.

(12) In each of the above embodiments, the semiconductor film of the channels of the TFT is made of the oxide semiconductor material. Other than that, continuous grain (CG) silicon, which is one kind of polysilicon or amorphous silicon may be used as a material for the semiconductor film.

(13) In each of the above embodiment sections, the liquid crystal panel that is configured to operate in FFS mode and the method of producing such a liquid crystal panel are described. However, the present invention may be applied to liquid crystal panels that are configured to operate in other modes such as in-plane switching (IPS) mode and vertical alignment (VA) mode.

(14) In each of the above embodiment sections, the color filters of the liquid crystal panel have the three-color configuration of red, green, and blue. However, the present invention may be applied to color filters have a four-color configuration including yellow color portions in addition to the red, the green, and the blue color portions.

(15) In each of the above embodiment sections, the liquid crystal panel that includes the liquid crystal layer that is sandwiched between the boards is described. However, the present invention may be applied to a display panel that includes functional organic molecules other than the liquid crystals sandwiched between the boards.

(16) In each of the above embodiments, the TFTs are used as the switching components of the liquid crystal panel. However, the present invention may be applied to a liquid crystal panel that includes switching components other than TFTs (e.g., thin film diodes (TFD)). The present invention may be applied to a liquid crystal panel that is configured to display black-and-white images other than the liquid crystal panel that is configured to display color images and a method of producing the liquid crystal panel.

(17) In each of the above embodiment sections, the liquid crystal panel is described. However, the present invention may be applied to other types of display panels (e.g., plasma display panels (PDPs), organic EL panels, electrophoretic display panels (PEDs), and micro electro mechanical systems (MEMS)).

EXPLANATION OF SYMBOLS

11: Liquid crystal panel (Display panel)
11*a*: CF board (Common board)
11*b*, 111*b*, 211*b*, 311*b*: Array board (Display board)
11*f*: TFT (Display component)
11*g*: Pixel electrode
11*h*: Common electrode
11*j*: Source line (Component line)
11*j*1: Line overlapping portion
11*p*: TFT connecting portion (Component connecting portion)
19, 119, 219, 319: First interlayer insulating film (Lower layer-side first insulating film, First insulating film)
19*a*: First interlayer insulating film edge section (First insulating film edge section)
20, 120, 220, 320: First planarization film (Upper layer-side first insulating film, First insulating film)
20*a*: First planarization film edge section (First insulating film edge section)
22, 122, 222, 322: Second planarization film (Second insulating film)

22a, 122a, 222a, 322a: Second planarization film edge section (Second insulating film edge section)
24, 124, 224: First transparent electrode film (Transparent electrode film)
25: Second interlayer insulating film (Third insulating film)
26: Second transparent electrode film (Second transparent electrode film)
27: Position detection electrode
28: Input terminal (Terminal)
29, 129, 229: Terminal line
29a: Line overlapping section
30, 130, 230: Protective member
31, 231: Projection
AA: Display area
CH2: Second TFT contact hole (Component contact hole)
CH3: Line contact hole
NAA: Non-display area
OP: Hole

The invention claimed is:

1. A display board comprising:
a display area for displaying images;
a non-display area located outside the display area to surround the display area;
a plurality of terminals disposed in the non-display area;
a first insulating film disposed to cross a boundary between the display area and the non-display area, the first insulating film including a first insulating film edge section disposed between the plurality of terminals and the display area;
a plurality of terminal lines disposed in a layer upper than the first insulating film at least in the non-display area to cross the first insulating film edge section and connected to the plurality of terminals;
a second insulating film disposed in a layer upper than the plurality of terminal lines to cross the boundary between the display area and the non-display area, the second insulating film including a second insulating film edge section disposed closer to the plurality of terminals relative to the first insulating film edge section; and
a plurality of protective members formed from a transparent electrode film and disposed in a layer upper than the second insulating film at least in the non-display area, the plurality of protective members covering sections of the plurality of terminal lines not overlapping the second insulating film, respectively;
wherein the first insulating film edge section crosses the plurality of terminal lines that are adjacent to each other, and the first insulating film edge section and the second insulating film edge section are not formed in a region of the non-display area in which the plurality of terminals is disposed.

2. The display board according to claim 1, wherein the second insulating film includes at least one projection projecting from the second insulating film edge section toward the plurality of terminals, the at least one projection being disposed between the adjacent terminal lines; and wherein the second insulating film edge section crosses the plurality of terminal lines that are adjacent to each other.

3. The display board according to claim 2, further comprising:
a display component disposed in the display area;
a component connecting portion disposed in a layer upper than the first insulating film in the display area and connected to the display component, the component connecting portion being in the layer in which the terminal lines are disposed;
a common electrode disposed in a layer upper than the second insulating film and including a hole at a position overlapping the component connecting portion, the common electrode being formed from the transparent electrode film that also forms the protective members;
a third insulating film disposed in a layer upper than the common electrode at least in the display area and including a component contact hole communicating with the second insulating film at a position overlapping the component connecting portion; and
a pixel electrode disposed in a layer upper than the third insulating film in the display area and connected to the component connecting portion via the component contact hole, the pixel electrode being formed from a second transparent electrode film.

4. The display board according to claim 3, wherein the common electrode functions as a position detection electrode to obtain an electrostatic capacitance between the position detection electrode and a position input object with which a position is input.

5. The display board according to claim 1, wherein
the second insulating film includes a section not overlapping the first insulating film and a section overlapping the first insulating film, and
the section not overlapping the first insulating film has a thickness smaller than a thickness of the section overlapping the first insulating film.

6. The display board according to claim 1, further comprising:
a display component disposed in the display area; and
a component line disposed in a layer lower than the first insulating film at least in the display area and connected to the display component, wherein
the terminal line and the component line include line overlapping sections that overlap each other in the non-display area,
the first insulating film includes a line contact hole at a position overlapping the line overlapping sections through which the line overlapping sections are connected with each other.

7. The display board according to claim 1, wherein the first insulating film includes a lower layer-side first insulating film and an upper layer-side first insulating film disposed in an upper layer side relative to the lower layer-side first insulating film.

8. A display device comprising:
the display board according to claim 1; and
a common board opposed to the display board.

* * * * *